(12) United States Patent
Yamazaki et al.

(10) Patent No.: US 7,897,979 B2
(45) Date of Patent: Mar. 1, 2011

(54) LIGHT EMITTING DEVICE AND MANUFACTURING METHOD THEREOF

(75) Inventors: Shunpei Yamazaki, Tokyo (JP); Takeshi Noda, Kanagawa (JP); Yoshinari Higaki, Kanagawa (JP)

(73) Assignee: Semiconductor Energy laboratory Co., Ltd. (JP)

( * ) Notice: Subject to any disclaimer, the term of this patent is extended or adjusted under 35 U.S.C. 154(b) by 287 days.

(21) Appl. No.: 10/454,124

(22) Filed: Jun. 4, 2003

(65) Prior Publication Data

US 2003/0227021 A1    Dec. 11, 2003

(30) Foreign Application Priority Data

Jun. 7, 2002    (JP) .............................. 2002-167758

(51) Int. Cl.
*H01L 29/04*    (2006.01)
(52) U.S. Cl. ............................. 257/83; 257/40; 257/59; 257/72; 257/88; 257/98; 257/E31.095; 257/E31.096
(58) Field of Classification Search ........... 257/79–103, 257/40, 59, 72, 88, 98, 99; 313/498, 504, 313/506
See application file for complete search history.

(56) References Cited

U.S. PATENT DOCUMENTS

| 4,411,735 A | 10/1983 | Belani |
| 5,047,687 A | 9/1991 | VanSlyke |
| 5,049,780 A | 9/1991 | Dobrowolski et al. ....... 313/509 |

(Continued)

FOREIGN PATENT DOCUMENTS

EP    0717445 A2    6/1996

(Continued)

OTHER PUBLICATIONS

T. Kamins, "Polycrystalline Silicon for Integrated Circuits and Displays", Kluwer Academic Publishers, Boston/Dordrecht/London, second edition (1998), pp. 301-302.*

(Continued)

*Primary Examiner*—Ahmed Sefer
(74) *Attorney, Agent, or Firm*—Husch Blackwell LLP

(57) ABSTRACT

A light emission device manufactured by a method of forming a curved surface having a radius of curvature to the upper end of an insulator 19, exposing a portion of the first electrode 18c to form an inclined surface in accordance with the curved surface, and applying etching so as to expose the first electrode 18b in a region to form a light emission region, in which emitted light from the layer containing the organic compound 20 is reflected on the inclined surface of the first electrode 18c to increase the total take-out amount of light in the direction of an arrow shown in FIG. 1A and, further, forming a light absorbing multi-layered film 24 comprising light absorbing multi-layered film on the first electrode 18c other than the region to form the light emission region, thereby obtaining a light emission device of a structure increasing the amount of light emission taken out in one direction in a light emission element, while not all the light formed in the layer containing the organic compound are taken out from the cathode as a transparent electrode toward TFT but the light was emitted also, for example, in the lateral direction (direction parallel with the plane of the substrate).

42 Claims, 15 Drawing Sheets

U.S. PATENT DOCUMENTS

| | | |
|---|---|---|
| 5,063,327 A | 11/1991 | Brodie et al. |
| 5,232,549 A | 8/1993 | Cathey et al. |
| 5,640,067 A | 6/1997 | Yamauchi et al. |
| 5,684,365 A | 11/1997 | Tang et al. |
| 5,742,129 A | 4/1998 | Nagayama et al. |
| 5,786,664 A | 7/1998 | Liu .............................. 313/506 |
| 5,839,456 A | 11/1998 | Han |
| 5,962,962 A | 10/1999 | Fujita et al. |
| 6,037,712 A | 3/2000 | Codama et al. |
| 6,091,195 A | 7/2000 | Forrest et al. ................. 313/504 |
| 6,107,158 A | 8/2000 | Zheng et al. |
| 6,114,715 A | 9/2000 | Hamada ....................... 257/72 |
| 6,194,837 B1* | 2/2001 | Ozawa .................... 315/169.1 |
| 6,222,315 B1 | 4/2001 | Yoshizawa et al. |
| 6,272,612 B1 | 8/2001 | Bordaz et al. |
| 6,306,559 B1 | 10/2001 | Tanamura et al. |
| 6,320,311 B2 | 11/2001 | Nakaya et al. |
| 6,380,687 B1* | 4/2002 | Yamazaki ................. 315/169.3 |
| 6,384,427 B1* | 5/2002 | Yamazaki et al. .............. 257/59 |
| 6,396,208 B1 | 5/2002 | Oda et al. .................... 313/504 |
| 6,403,289 B1 | 6/2002 | Tanaka et al. |
| 6,406,804 B1* | 6/2002 | Higashi et al. ............... 428/690 |
| 6,420,834 B2 | 7/2002 | Yamazaki et al. |
| 6,432,845 B1* | 8/2002 | Morozumi .................. 438/789 |
| 6,433,487 B1 | 8/2002 | Yamazaki |
| 6,441,873 B2 | 8/2002 | Young |
| 6,445,005 B1 | 9/2002 | Yamazaki et al. |
| 6,456,003 B1* | 9/2002 | Mori et al. .................... 313/504 |
| 6,462,722 B1 | 10/2002 | Kimura et al. |
| 6,475,836 B1 | 11/2002 | Suzawa et al. |
| 6,501,217 B2 | 12/2002 | Beierlein et al. |
| 6,515,310 B2 | 2/2003 | Yamazaki et al. ............... 257/98 |
| 6,518,700 B1 | 2/2003 | Friend et al. |
| 6,522,315 B2 | 2/2003 | Ozawa et al. |
| 6,528,824 B2 | 3/2003 | Yamagata et al. |
| 6,538,374 B2 | 3/2003 | Hosokawa |
| 6,538,390 B2 | 3/2003 | Fujita et al. ............... 315/169.3 |
| 6,555,968 B2 | 4/2003 | Yamazaki et al. |
| 6,597,111 B2 | 7/2003 | Silvernail et al. ........... 313/506 |
| 6,597,121 B2 | 7/2003 | Imura |
| 6,599,783 B2 | 7/2003 | Takatoku .................... 438/148 |
| 6,605,826 B2 | 8/2003 | Yamazaki et al. ............. 257/72 |
| 6,608,353 B2 | 8/2003 | Miyazaki et al. |
| 6,608,449 B2 | 8/2003 | Fukunaga |
| 6,614,085 B2* | 9/2003 | Hu .............................. 257/437 |
| 6,614,174 B1 | 9/2003 | Urabe et al. |
| 6,624,571 B1 | 9/2003 | Toyoyasu et al. |
| 6,628,065 B2 | 9/2003 | Araki et al. |
| 6,641,933 B1 | 11/2003 | Yamazaki et al. |
| 6,690,034 B2 | 2/2004 | Fujimoto et al. |
| 6,692,845 B2 | 2/2004 | Maruyama et al. .......... 428/690 |
| 6,699,739 B2 | 3/2004 | Yamazaki et al. ........... 438/156 |
| 6,717,181 B2 | 4/2004 | Murakami et al. |
| 6,720,572 B1 | 4/2004 | Jackson et al. ................ 257/40 |
| 6,737,306 B2 | 5/2004 | Yamazaki et al. |
| 6,739,931 B2 | 5/2004 | Yamazaki et al. |
| 6,740,457 B2 | 5/2004 | Takizawa |
| 6,750,618 B2 | 6/2004 | Yamazaki et al. |
| 6,768,534 B2 | 7/2004 | Iwase et al. ................. 349/153 |
| 6,787,796 B2 | 9/2004 | Do et al. |
| 6,788,356 B2 | 9/2004 | Song |
| 6,798,132 B2 | 9/2004 | Satake |
| 6,805,977 B2 | 10/2004 | Sotoyama et al. ........... 428/690 |
| 6,831,408 B2 | 12/2004 | Hirano et al. |
| 6,839,045 B2 | 1/2005 | Ozawa et al. |
| 6,853,130 B2 | 2/2005 | Morii |
| 6,858,878 B2 | 2/2005 | Yamazaki et al. ............ 257/98 |
| 6,869,635 B2 | 3/2005 | Kobayashi |
| 6,881,501 B2 | 4/2005 | Yudasaka |
| 6,894,312 B2 | 5/2005 | Yamazaki et al. |
| 6,956,324 B2 | 10/2005 | Yamazaki |
| 6,958,490 B2 | 10/2005 | Okamoto et al. |
| 6,969,291 B2 | 11/2005 | Urabe et al. |
| 6,977,463 B2 | 12/2005 | Sato |
| 6,995,511 B2 | 2/2006 | Yamazaki et al. |
| 7,015,503 B2 | 3/2006 | Seki et al. |
| 7,098,602 B2 | 8/2006 | Yamazaki et al. |
| 7,112,374 B2 | 9/2006 | Yamazaki et al. |
| 7,138,762 B2 | 11/2006 | Morii |
| 7,180,483 B2 | 2/2007 | Kimura et al. |
| 7,187,121 B2 | 3/2007 | Hasegawa et al. |
| 7,190,111 B2 | 3/2007 | Lee et al. |
| 7,214,959 B2 | 5/2007 | Seki et al. |
| 7,221,339 B2 | 5/2007 | Ozawa et al. |
| 7,253,793 B2 | 8/2007 | Ozawa et al. |
| 7,256,422 B2 | 8/2007 | Yamazaki |
| 7,273,801 B2 | 9/2007 | Seki et al. |
| 7,301,276 B2 | 11/2007 | Yamazaki et al. |
| 7,332,859 B2 | 2/2008 | Hasegawa et al. |
| 7,358,531 B2 | 4/2008 | Koyama |
| 7,427,832 B2 | 9/2008 | Kobayashi |
| 7,548,027 B2 | 6/2009 | Yamazaki |
| 2001/0011868 A1 | 8/2001 | Fukunaga et al. ........... 313/506 |
| 2001/0013913 A1* | 8/2001 | Young ........................ 349/113 |
| 2001/0020922 A1* | 9/2001 | Yamazaki et al. ............. 345/45 |
| 2001/0026125 A1 | 10/2001 | Yamazaki et al. |
| 2001/0046003 A1* | 11/2001 | Song ........................... 349/43 |
| 2001/0054867 A1* | 12/2001 | Kubota ....................... 313/504 |
| 2002/0011597 A1 | 1/2002 | Fujimoto et al. |
| 2002/0025643 A1 | 2/2002 | Akram et al. |
| 2002/0039730 A1 | 4/2002 | Morii ............................ 435/6 |
| 2002/0043932 A1* | 4/2002 | Kawashima ................ 313/512 |
| 2002/0047509 A1* | 4/2002 | Araki et al. .................. 313/479 |
| 2002/0050795 A1 | 5/2002 | Imura ...................... 315/169.3 |
| 2002/0063287 A1* | 5/2002 | Yamazaki et al. ........... 257/347 |
| 2002/0121860 A1 | 9/2002 | Seo et al. |
| 2003/0062826 A1 | 4/2003 | Seo et al. ..................... 313/504 |
| 2003/0082465 A1* | 5/2003 | Takizawa ....................... 430/7 |
| 2003/0193493 A1* | 10/2003 | Ozawa ........................ 345/204 |
| 2003/0197466 A1 | 10/2003 | Yamazaki et al. ........... 313/504 |
| 2003/0201447 A1 | 10/2003 | Yamazaki et al. ............ 257/79 |
| 2003/0201716 A1 | 10/2003 | Yamazaki et al. ........... 313/506 |
| 2003/0231273 A1 | 12/2003 | Kimura et al. |
| 2004/0012747 A1 | 1/2004 | Yamazaki et al. ........... 349/153 |
| 2004/0171182 A1 | 9/2004 | Yamazaki et al. ............. 438/22 |
| 2004/0195964 A1 | 10/2004 | Yamazaki et al. |
| 2005/0001541 A1 | 1/2005 | Yamazaki et al. ........... 313/503 |
| 2005/0012445 A1 | 1/2005 | Yamazaki et al. ........... 313/500 |
| 2005/0073243 A1 | 4/2005 | Yamazaki et al. ........... 313/498 |
| 2005/0162092 A1 | 7/2005 | Yamazaki et al. |
| 2005/0186403 A1 | 8/2005 | Seki et al. |
| 2005/0247938 A1 | 11/2005 | Okamoto et al. |
| 2006/0014465 A1 | 1/2006 | Yamazaki |
| 2006/0017374 A1 | 1/2006 | Hasegawa et al. |
| 2006/0082300 A1 | 4/2006 | Yamazaki et al. |
| 2006/0267030 A1 | 11/2006 | Yamazaki et al. |
| 2006/0273995 A1 | 12/2006 | Ozawa et al. |
| 2006/0273996 A1 | 12/2006 | Ozawa et al. |
| 2006/0279491 A1 | 12/2006 | Ozawa et al. |
| 2007/0007870 A1 | 1/2007 | Yamazaki et al. |
| 2007/0096641 A1 | 5/2007 | Hasegawa et al. |
| 2008/0252207 A1 | 10/2008 | Yamazaki et al. |
| 2008/0258617 A1 | 10/2008 | Kobayashi |

FOREIGN PATENT DOCUMENTS

| | | |
|---|---|---|
| EP | 0781075 A1 | 6/1997 |
| EP | 0895219 A1 | 2/1999 |
| EP | 0917127 A1 | 5/1999 |
| EP | 0989778 A1 | 3/2000 |
| EP | 1 065 723 A2 * | 1/2001 |
| EP | 1065723 A2 | 1/2001 |
| EP | 1085576 A2 | 3/2001 |
| EP | 1087448 A2 | 3/2001 |

| | | |
|---|---|---|
| EP | 1 102 317 A2 | 5/2001 |
| EP | 1255240 A1 | 11/2002 |
| EP | 1336953 A2 | 8/2003 |
| EP | 1337131 A2 | 8/2003 |
| EP | 1359789 A1 | 11/2003 |
| EP | 1363265 A2 | 11/2003 |
| EP | 1619654 A1 | 1/2006 |
| EP | 1793650 A2 | 6/2007 |
| EP | 1830342 A2 | 9/2007 |
| EP | 1830343 A2 | 9/2007 |
| EP | 1830344 A2 | 9/2007 |
| JP | 10-289784 | 10/1998 |
| JP | 11-329741 | 11/1999 |
| JP | 11-339970 | 12/1999 |
| JP | 2000-077181 | 3/2000 |
| JP | 2000-193994 | 7/2000 |
| JP | 2000-269473 | 9/2000 |
| JP | 2001-43981 | 2/2001 |
| JP | 2001-52870 | 2/2001 |
| JP | 2001-154001 | 6/2001 |
| JP | 2001-338771 | 12/2001 |
| JP | 2001-351787 | 12/2001 |
| JP | 2002-008566 | 1/2002 |
| JP | 2002-015860 | 1/2002 |
| JP | 2002-071902 | 3/2002 |
| JP | 2002-132186 | 5/2002 |
| JP | 2002-198182 | 7/2002 |
| JP | 2002-208491 | 7/2002 |
| JP | 2002-352963 | 12/2002 |
| JP | 2003-017272 | 1/2003 |
| JP | 2003-017273 | 1/2003 |
| WO | WO99-01856 | * 1/1999 |
| WO | WO-99/43028 A1 | 8/1999 |
| WO | WO 01/08240 | 2/2001 |

OTHER PUBLICATIONS

Merriam-Webster's Collegiate Dictionary, tenth Edition (1998), Merriam-Webster Inc., Springfield, MA (USA), p. 827.*

Merriam-Webster's Collegiate Dictionary, tenth Edition (1998), Merriam-Webster Inc., Springfield, MA (USA), p. 653.*

Office Action concerning U.S. Appl. No. 10/422,380, mailed on Nov. 12, 2004.

U.S. Appl. No. 10/419,640 (pending) to Yamazaki et al filed Apr. 21, 2003, including specification, abstract, claims, drawings and PTO filing receipt.

U.S. Appl. No. 10/421,238 (pending) to Yamazaki et al filed Apr. 23, 2003, including specification, abstract, claims, drawings and PTO filing receipt.

U.S. Appl. No. 10/422,380 (pending) to Yamazaki et al filed Apr. 24, 2003, including specification, abstract, claims, drawings and PTO filing receipt.

U.S. Appl. No. 10/602,980 (pending) to Yamazaki et al filed Jun. 24, 2003, including specification, abstract, claims and drawings.

* cited by examiner

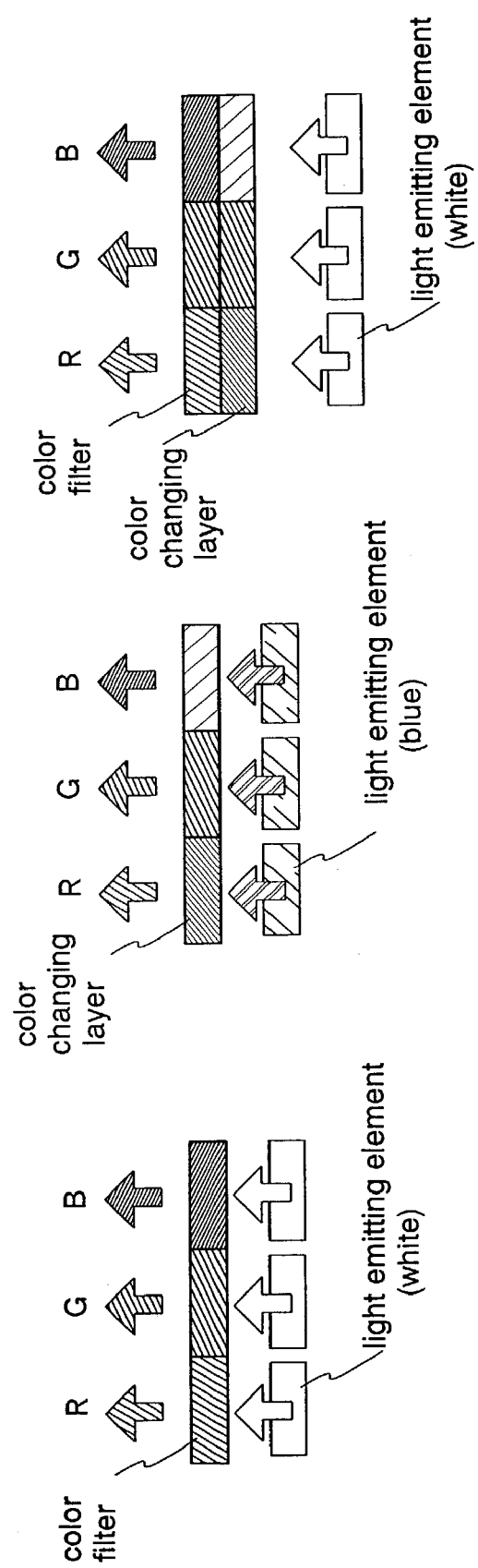

A-A' sectional view light emitting region

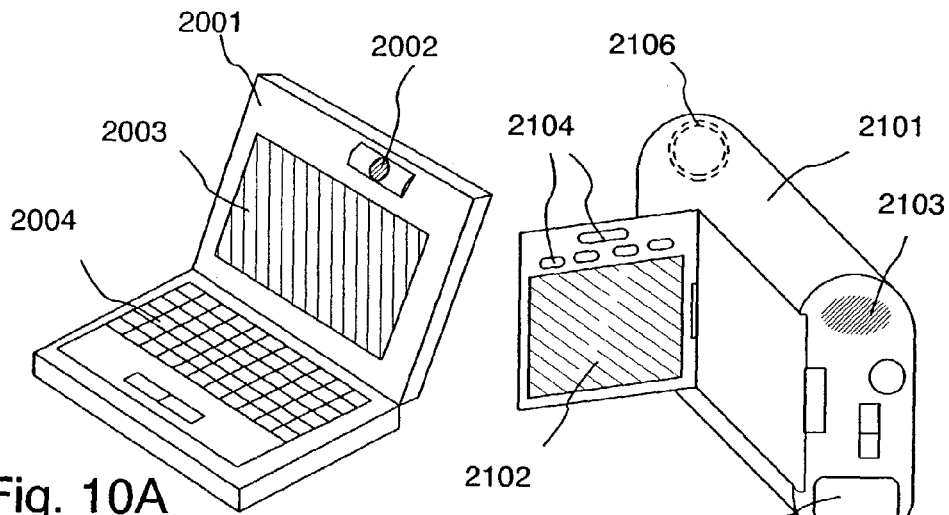
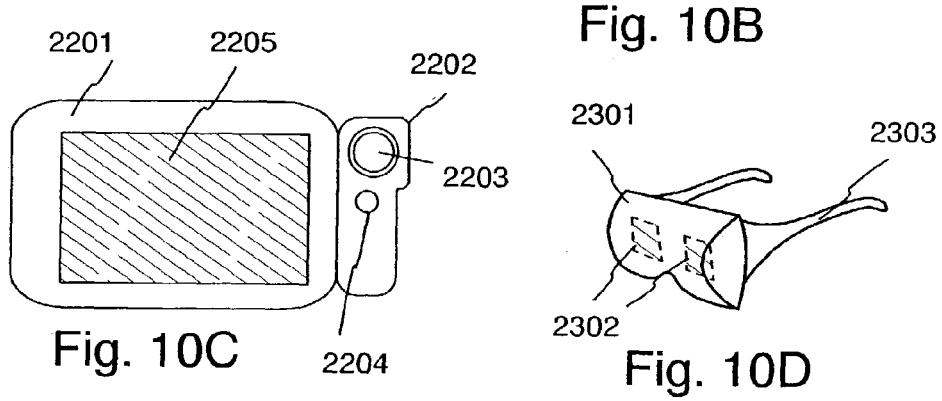
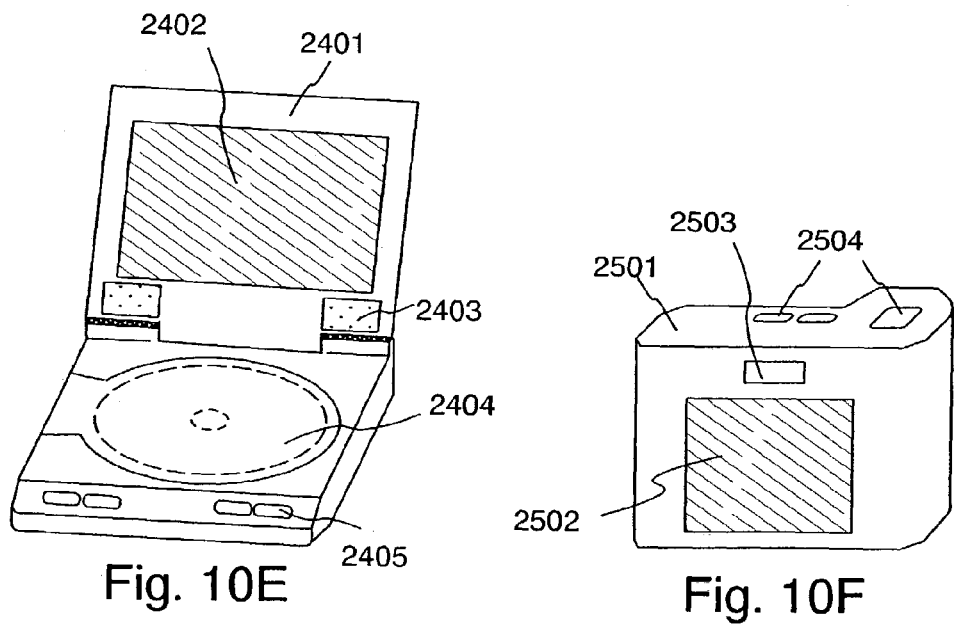

SiN/TiN/SiN/Al = 37/66/37/100 nm

SiN/TiN/SiN/Al = 42/66/27/100 nm

Reflectance with second seal agent

LIGHT EMITTING DEVICE AND MANUFACTURING METHOD THEREOF

BACKGROUND OF THE INVENTION

1. Field of the Invention

The present invention relates to a light emitting device with a light emitting element that emits fluorescent light or phosphorescent light upon application of electric field to a pair of electrodes of the element which sandwich a layer containing an organic compound, and to a method of manufacturing the light emitting device. In this specification, the term light emitting device includes an image display device, a light emitting device and a light source (including illuminating device). Also, the following modules are included in the definition of the light emitting device: a module obtained by attaching to a light emitting device a connector such as an FPC (flexible printed circuit; terminal portion), a TAB (tape automated bonding) tape, or a TCP (tape carrier package); a module in which a printed wiring board is provided at an end of the TAB tape or the TCP; and a module in which an IC (integrated circuit) is directly mounted to a light emitting element by the COG (chip on glass) system.

2. Description of the Related Art

Light emitting elements, which employ organic compounds as light emitting member and are characterized by their thinness and light weight, fast response, and direct current low voltage driving, are expected to develop into next-generation flat panel displays. Among display devices, ones having light emitting elements arranged to form a matrix shape are considered to be particularly superior to the conventional liquid crystal display devices for their wide viewing angle and excellent visibility.

It is said that light emitting elements emit light through the following mechanism: a voltage is applied between a pair of electrodes that sandwich a layer containing an organic compound, electrons injected from the cathode and holes injected from the anode are re-combined at the luminescent center of the layer containing the organic compound to form molecular excitons, and the molecular excitons return to the base state while releasing energy to cause the light emitting element to emit light. Known as excitation states are singlet excitation and triplet excitation, and it is considered that luminescence can be conducted through either one of those excitation states.

Such light emitting devices having light emitting elements arranged to form a matrix can employ passive matrix driving (simple matrix light emitting devices), active matrix driving (active matrix light emitting devices), or other driving methods. However, if the pixel density is increased, active matrix light emitting devices in which each pixel (or each dot) has a switch are considered as advantageous because they can be driven with low voltage.

A layer containing an organic compound (strictly speaking, light emitting layer), which is the center of a light emitting element, is classified into low molecular weight materials and polymeric (polymer) materials. Both types of materials are being studied but polymeric materials are the ones that are attracting attention because they are easier to handle and have higher heat resistance than low molecular weight materials.

The conventional active matrix type light emitting device has the structure comprising a light emitting element in which an electrode electrically connected with TFT on a substrate is formed as an anode, a layer containing an organic compound is formed thereon, and cathode is formed thereon. And light generated in the layer containing the organic compound can be observed at the TFT side through the anode that is a transparent electrode.

There has been a problem in the structure that an opening ratio is restricted depending on an arrangement of TFT and wirings in a pixel portion when definition is to be improved.

Therefore, manufactured in the present invention is an active matrix light emitting device that has a light emitting element with a structure called a top emission structure. In the top emission structure, a TFT side electrode which is electrically connected to a TFT on a substrate serves as an anode (or a cathode), a layer containing an organic compound is formed on the anode (or the cathode), and a cathode (or an anode) that is a transparent electrode is formed on the layer containing an organic compound.

Compared to the bottom emission structure, the number of material layers through which light emitted from the layer containing the organic compound passes is smaller in the top emission structure and stray light caused between material layers of different refractive indexes is accordingly reduced.

Not all of light generated in the layer containing the organic compound are taken out in the direction toward the TFT from the transparent electrode serving as the cathode (or the anode). For example, light emitted in the lateral direction (the direction parallel to the substrate face) is not taken out and therefore is a loss. An object of the present invention is to provide a light emitting device structured so as to increase the amount of light which is taken out in a certain direction after emitted from a light emitting element, as well as a method of manufacturing this light emitting device.

A problem of the top emission structure is that its transparent electrode has high film resistance. The film resistance becomes even higher when the thickness of the transparent electrode is reduced. When the transparent electrode that serves as a cathode (or an anode) is high in film resistance, a voltage drop makes the intra-plane electric potential distribution uneven and the luminance becomes fluctuated among light emitting elements. Another object of the present invention is therefore to provide a light emitting device structured so as to lower the film resistance of a transparent electrode in a light emitting element, as well as a method of manufacturing the light emitting device. Still another object of the present invention is to provide an electric appliance that uses this light emitting device as its display unit.

In accordance with the present invention, a laminate of metal films and a light absorbing multi-layered film are formed continuously, patterning is conducted to form a first electrode comprising metal films covered with the light absorbing multi-layered film, an insulator covering the end of the first electrode (referred to as bank or partition wall), then etching is conducted in a self-alignment manner using the insulator as a mask and a portion of the insulator is etched and a central portion of the first electrode is etched thinly to form a step at the end. By the etching, the first electrode is formed thinly at a central portion and as a planar surface while the first electrode is formed thick at the portion covered with the insulator, that is, in a concaved shape. A light absorbing multi-layered film is disposed on the portion of the first electrode covered with the insulator to absorb external light. Then, a layer containing an organic compound and a second electrode are formed at least on the central portion of the first electrode, to complete a light emission device.

In the present invention, emitted light in the lateral direction is reflected or collected at an inclined surface formed in the first electrode to increase the amount of emitted light taken out in one direction (direction passing through the second electrode).

Accordingly, the portion to form the inclined surface is preferably made of a light reflecting metal, for example, a material mainly comprising, for example, aluminum or silver, while a central portion in contact with the layer containing the organic compound is preferably made of an anode material of larger work function, or a cathode material of smaller work function. When the portion to form the inclined surface is made of a material, for example, comprising aluminum or silver as a main ingredient, since it reflects external light, it is preferred that portions other than the inclined surface are covered with a material of low reflectance, preferably, a light absorbing multi-layered film.

The light absorbing multi-layered film may be formed, for example, by laminating a silicon nitride film, a metal nitride film (typically, titanium nitride film, tantalum nitride film, etc.) and a silicon nitride film each at an appropriate film thickness on a metal layer of high reflectance (typically, metal layer comprising aluminum as a main ingredient) and, when external light is incident, it is decreased by optical interference absorption caused between each of the layers. The region where the light absorbing multi-layered film is disposed does not overlap with the emitted light region.

Further, the inclined surface formed in the first electrode prevents emitted light from the light emission device (also including emitted light in the lateral direction) from reaching a TFT.

The constitution 1 of the invention disclosed in the present specification provides;

a light emission element comprising, on a substrate having an insulative surface, a first electrode connected with a thin film transistor and an insulator covering the end of the first electrode and a layer containing an organic compound in contact with the first electrode and a second electrode in contact with the layer containing the organic compound, in which the first electrode has an inclined surface, the inclined surface reflects emitted light from the layer containing the organic compound, and a light absorbing multi-layered film absorbing external light is disposed on the portion of the first electrode covered with the insulator.

The constitution 2 of another invention provides a light emission device including;

a light emission element comprising, on a substrate having an insulative surface, a first electrode connected with a thin film transistor, an insulator covering the end of the first electrode, and a layer containing an organic compound in contact with the first electrode and a second electrode in contact with the layer containing the organic compound, in which the first electrode is formed as a concave shape in which the central portion has a reduced film thickness than that at the end, and a light absorbing multi-layered film for absorbing external light is disposed on the portion of the first electrode covered with the insulator.

Further, the constitution 3 of a further invention provides a light emission device including;

a light emission element comprising, on a substrate having an insulative surface, a first electrode connected with a thin film transistor, an insulator covering a portion of the first electrode covered with the insulator, and a layer containing an organic compound in contact with the first electrode and a second electrode in contact with the layer described above, in which the first electrode has a multi-layered structure in which the number of laminate at the end is larger than the number of laminate at the central portion in the first electrode, and a light absorbing multi-layered film absorbing external light is disposed on the portion of the first electrode covered with the insulator.

Further, the light absorbing multi-layered film absorbing external light is disposed also on wirings or electrodes formed in one identical step and the constitution 4 of a further invention provides a light emission device, including, a light emission element comprising, on a substrate having an insulative surface, a first electrode connected with a thin film transistor, an insulator covering the end of the first electrode, and a layer containing an organic compound in contact with the first electrode and a second electrode in contact with the layer containing the organic compound, in which the wirings or the electrode formed on one identical layer with the first electrode are in a multi-layered structure, and the light absorbing multi-layered film absorbing external light is disposed.

Further, in accordance with the invention, the shape of an insulator (referred to bank, partition wall, barrier wall, etc.) disposed between each of pixels is improved for eliminating coverage failure, etc. upon forming an layer containing an organic compound layer comprising a polymeric material by a coating method. In each of the constitutions described above, the upper end of the insulator is provided with a curved surface having a radius of curvature, and the radius of curvature is from 0.2 µm to 3 µm. Further, the tapered angle for the insulator may be 35° to 70°.

By the provision of the radius of curvature, the step coverage is enhanced and a layer containing an organic compound to be formed subsequently can be formed even when it is extremely thin.

Further, in each of the constitutions described above, the first electrode has an inclined surface directing to the central portion of the first electrode and the angle of inclination (also referred to as a tapered angle) is larger than 50° and smaller than 60° and, more preferably, 54.7°. It is necessary that the angle of inclination, the material and the thickness of the layer containing the organic compound, or the material and the thickness of the second electrode are properly selected such that the light reflected on the inclined surface of the first electrode is not dispersed between layers or does not form stray light.

Increment in the take-out efficiency in a case of adopting the structure of the invention is simulated by the procedures described below.

At first, the effect of the structure according to the invention is estimated by regarding the emission from a layer containing an organic compound as optical rays emitted evenly in all of the directions and considering the same geometrically.

Snell's law (ni·sin θi=nj·sin θj, upon incident at an angle θi from a film with a refractive index ni and transmission at an angle θj to a film with a refractive index ni) and total reflection condition (all optical rays are reflected along the path symmetrical with a normal line upon exceeding the value for θi at θj=90° according to Snell's law (critical angle)) are used as a basic law.

The conditions when light emits from the parallel multi-layered film into atmospheric air are considered as below.

As shown in FIG. 12, when the path of light from a layer containing an organic compound transmitting the parallel multi-layered film and outgoing to atmospheric air is observed, a relation: (nel sin θel=nl·sin θl= - - - =sin θair) is established according to the law described above. Note that, nel and nl denote reflective indexes of a layer containing an organic compound and the layer on the layer containing the organic compound, respectively. And the reflective index of air is assumed 1. When the θair is less than 90°, θ1 etc. are also less than 90° (θel in case of θair=90° is defined as θc). So long as the light emits to the atmospheric air, it does not reflected totally at the boundary in the inside. Accordingly, the condition of θel under which the light goes to the atmospheric air may be θ<θel<θc.

Referring to the structure shown in FIG. 13, the light outgoing into the atmospheric air includes the following two types of paths. That is, it includes a case not reflecting on the inclined surface but outgoing to the atmospheric air (path 1) and a case of outgoing into atmospheric air by way of reflection on the inclined surface (path 2). In the path 1, since the path of the light is identical with a simple case of transmitting the parallel multi-layered film, the condition outgoing to the atmospheric air is: 0<θel<θc. In the case of the path 2, by re-arranging the inclined surface in the case of path 2 into the case of FIG. 14, it can be seen that the path 2 is identical with the case of the path 1 in which the incident angle changes from θel to θel±θt. Thus, the condition outgoing into the atmospheric air can be expressed as: 0<θel±θt<θc. However, since θc<θel at the horizontal portion because it has to be totally reflected, it is after all only 0<θel−θt<θc. That is, as shown in FIG. 14, while there are two ways of incidence to the inclined surface for one θel, only one of them can transmit.

Further, the efficiency for taking out emitted light is considered as described below. The ratio of the range of the angle at which the light starting from the vertical intermediate point of the layer containing the organic compound outgoes into the atmospheric air relative to the total solid angle is defined as a take-out efficiency. Since the ratio of the angle of light from θ to θ+dθ can be substituted with an area ratio on a unitary spherical surface having an emission point as the center as shown in FIG. 15, it is (2π sin θdθ)/4π. Accordingly, when the range θ is θ1 to θ2, {2π (−cos θ1+cos θ2)}/4π is defined as a ratio of the light take-out efficiency. Thus, assuming that the entire element has a structure symmetrical with the axis of a normal line, the light take out efficiency can be determined from the permissible range for θel being considered in a two-dimensional manner.

Assuming the refractive index of air as 1 and the refractive index of the layer containing the organic compound as 1.78 (the refractive index of Alq3, which is representative example of the layer containing the organic compound), sin 90°=1.73 sin θc is established according to the Snell's law, and θc=35.31° can be obtained. In the case of path 1, the range for emission angle is: 0<θel<θc in view of 0<θel<θc, and the take out efficiency is 18.4% in view of −cos θ+cos θ=0.184. In a case of path 2, θel>θc is required because the total reflection condition must be met. We obtain θt<θel<θc+θt from 0<θel−θt<θc. When θt<θc, the lower limit for θt<θel<θc+θt changes in which the range for outgoing angle is: θc<θel<θc+θt and the take out efficiency is (−cos (θc+θt)+cos θc)/2. Further, in a case of: θc+θt>π/2, the upper limit for θt<θel<θc+θt changes in which the range for outgoing angle is θt<θel<π/2 and the take out efficiency is (−cos π/2+cos θt)/2. In addition, in a case of: (θc<θt<π/2−θc), θt<θel<θc+θt is established as it is in which the range for outgoing angle is θt<θel<θc+θt and the take out efficiency is: −cos(θc+θt)+cos θt)/2. The relation between the increases of light take-out efficiency due to the inclined surface formed in the first electrode, and the tapered angle θt for the inclined surface is introduced as shown in FIG. 2B. In FIG. 2B, peaks for the increases of light take-out efficiency is present at the points of: θt=54.69°. The result in FIG. 2B is a result of simulation not considering the absorption and interference of light in the film, assuming the vertical intermediate point of the layer containing the organic compound as the light emission point.

Further, FIG. 18 shows the reflectance of an aluminum film containing a slight amount of Ti and reflectance of a TiN film (100 nm).

Further, in each of the constitutions described above, the second electrode is a light transmitting conductive film, for example, a thin metal film, a transparent conductive film, or a laminate thereof.

In each of the constitutions described above, the first electrode has a concaved shape and the concaved shape is formed in a self-alignment manner using the insulator as a mask. Accordingly, there is no increase of the mask in view of the formation of the first electrode shape. The end portion of the concaved shape (upper end of the inclined surface) substantially agrees with the lateral side of the insulator and, in view of the step coverage, the angle of inclination on the inclined surface of the first electrode is desirably identical with the angle of inclination on the lateral side of the insulator.

In each of the constitutions, the first electrode is an anode and the second electrode is a cathode. Alternatively, in each of the constitutions described above, the first electrode is a cathode and the second electrode is an anode.

Further, in each of the constitutions described above, the light absorbing multi-layered film formed on the portion of the first electrode covered with the insulator contains at least one layer of a light transmitting nitride insulation film. Specifically, the light absorbing multi-layered film disposed on the first electrode at least has a three-layered structure comprising a light transmitting film, a film partially absorbing light and a light transmitting film, in which the light transmitting film contains at least one layer comprising $Al_2O_3$, $SiO_2$, $ZrO_2$, $HfO_2$, $Sc_2O_3$, $TiO_2$, ITO or ZnO.

Alternatively, in each of the constitutions described above, the light absorbing multi-layered film formed on the first electrode may be a light absorbing multi-layered film containing at least one layer of a light transmitting nitride insulation film. The reflectance can be reduced to 5% or less by using a laminate comprising a silicon nitride film, a titanium nitride film and a silicon nitride film. Similar effect can also be obtained by using a brown or black metal film such as a tantalum nitride film instead of titanium nitride.

Further, in each of the constitutions described above, other film partially absorbing light may be a film containing at least one layer comprising Al, Cu, Au, Mo, Ni, Pt, Rh, Ag, W, Cr, Co, Si, Zr, Ta, INCONEL or NICHROME.

Further, each of the constitutions described above provides a light emission device in which the layer containing the organic compound is made of a material that emits white light and combined with a color filter disposed to a sealant or a light emission device in which the layer containing the organic compound is made of a material that emits a monochromatic light combined with a color conversion layer or a coloring layer disposed to the sealant.

Further, in accordance with the invention, after forming the concave shape of the first electrode, auxiliary wirings (also referred to as auxiliary wirings or third electrode) by vapor deposition using a vapor deposition mask may be formed on the insulator disposed between each of the pixel electrodes to lower the film resistance of the second electrode as a cathode (light transmitting electrode). Further, it is also a feature of the invention to form lead wirings by using the auxiliary wirings and conduct connection with other wirings present in the lower layer.

Further, the constitution of the invention for attaining each of the constitutions 1, 2, 3 and 4 above provides a method of manufacturing a light emission device comprising an anode, a layer containing an organic compound adjacent with the anode, and a cathode adjacent with the layer containing the organic compound, the method comprising the steps of forming a light absorbing multi-layered film continuously without exposure to atmospheric air, forming an insulator covering the end of a first electrode comprising the metal film, conducting etching using the insulator as a mask to reduce the thickness at the central portion of the first electrode such that an inclined surface is exposed in the first electrode, forming a film containing an organic compound, and forming a second electrode comprising a light transmitting thin film on the film containing the organic compound.

In the constitution of the manufacturing method described above, a laminate comprising a light reflecting metal film and a metal film as an etching stopper are used in which the light reflecting metal film is etched and the light reflecting metal material is exposed to the inclined surface.

In the constitution of the manufacturing method described above, the first electrode is an anode and comprises a metal layer having a larger work function than the second electrode.

In the constitution of the manufacturing method, the step of continuously forming the second electrode and the light absorbing multi-layered film is conducted by a sputtering method.

In the constitution of the manufacturing method described above, the first electrode is a cathode and comprises a metal layer having a smaller work function than the second electrode.

Further, in the constitution of the manufacturing method described above, the insulator covering the end of the first electrode has a curved surface with a radius of curvature at the upper end, and the radius of curvature is 0.2 μm to 3 μm.

The EL element has a layer containing an organic compound capable of obtaining luminescence generated by application of an electric field (Electro Luminescence), an anode and a cathode. The luminescence in the organic compound includes light emission upon recovery from a singlet excited state to the ground state (fluorescence), and light emission upon recovery from a triplet excited state to the ground state (phosphorescence). The light emission device manufactured by the manufacturing device and the deposition method according to the invention is applicable to both of the emission forms.

The light emission element having a layer containing an organic compound has a structure in which the layer containing the organic compound is sandwiched between a pair of electrodes, and the layer containing the organic compound usually comprises a laminate structure. Typical structure includes a laminate structure of "hole transportation layer/light emission layer/electron transportation layer" proposed by Tang, et al. of Kodak Eastman Company. The structure shows an extremely high emission efficiency and most of light emission devices under research and development at present adopt the structure.

Further, structures formed by laminating, on the anode, hole injection layer/hole transportation layer/light emission layer/electron transportation layer, or hole injection layer/hole transportation layer/light emission layer/electron transportation layer/electron injection layer in this order may also be used. Fluorescent dye, etc. may be doped to the light emission layer. Further, all of the layers described above may be formed by using low molecular weight material or by using high molecular weight material. In the present specification, all the layers disposed between the cathode and the anode are collectively referred to as the layer containing the organic compound. Accordingly, all of the hole injection layer, hole transportation layer, light emission layer, electron transportation layer and electron injection layer are included in the layer containing the organic compound.

Further, in the light emission device of the invention, there is no particular restriction on the driving method of screen display and successive spot driving method or successive line driving method or successive plane driving method, etc. may be used. Typically, the successive line driving method may be used while properly adopting time divisional graduation driving method or area gradation driving method. Further, video signals inputted to the source line of the light emission device may be analog signals or digital signals and driving circuits and the like may be designed while properly adapted for video signals.

BRIEF DESCRIPTION OF THE DRAWINGS

FIGS. 5A to 5C are diagrams showing an Embodiment Mode 2.
FIGS. 10A to 10F are diagrams showing examples of electronic apparatuses.

DESCRIPTION OF PREFERRED EMBODIMENT MODE

Preferred embodiment mode of the present invention are to be described specifically.

Figure 1A:
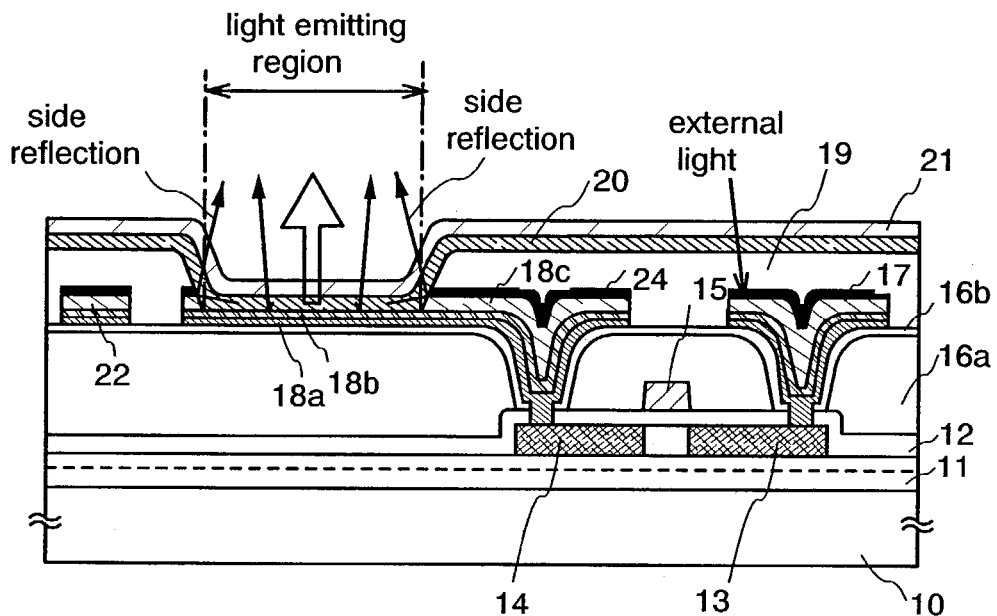
FIGS. 1A, 1B and 2A are diagrams showing an Embodiment Mode 1.

FIG. 1A shows a cross sectional view of an active matrix type light emission device (portion of one pixel). Description is to be made as an example of a light emission element using a layer containing an organic compound comprising a high molecular weight material that emits white light as a light emission layer.

In FIG. 1A, a TFT (p-channel TFT) disposed on a substrate 10 having an insulative surface is an element that controls the current flowing in an layer containing an organic compound 20 that emits white light, and 13 or 14 denotes a source region or a drain region. An under layer insulation film 11 (lower layer is a nitride insulation film, upper layer is an oxide insulation film) is formed on the substrate 10, and a gate insulation film 12 is disposed between a gate electrode 15 and an active layer. Further, 16a denotes an interlayer insulation film comprising an organic material or an inorganic material and 16b denotes a protection film made of a silicon nitride film, a silicon oxynitride film, an aluminum nitride film or an aluminum oxynitride film. Although not illustrated, one or plurality of TFT (n-channel TFT or p-channel TFT) is disposed in one picture cell. Further, while TFT having one channel forming region is shown but this is not restrictive and TFT may comprise plural channel forming regions.

Further, 18a-c denote a first electrode, that is, an anode (or cathode) of an organic light emission device (OLED) and 21 denotes a second electrode comprising a conductive film, that is, a cathode (or anode) of the OLED. The region that actually functions as the anode (or cathode) is indicated at 18b. A titanium film 18a, a titanium nitride film 18b and a film 18c comprising aluminum as the main ingredient are laminated successively and the film 18b in contact with the layer 20 containing the organic compound is operated as the anode. Further, a power source supply line 17 is formed also by an identical laminate structure. The laminate structure includes a film comprising aluminum as a main ingredient and can form wirings of low resistance, and source wirings 22, etc. are also formed simultaneously.

For preventing reflection, a light absorbing multi-layered film 24 is disposed on the film 18c. This is also disposed on the power source supply source 17 and the source wirings 22.

The light absorbing multi-layered film 24 absorbing external light includes, as a typical laminate structure, a three layered structure formed by successively laminating a light transmitting film, a film partially absorbing light and a light transmitting film. The light transmitting film may be a film comprising $Al_2O_3$, $SiO_2$, $ZrO_2$, $HfO_2$, $Sc_2O_3$, $TiO_2$, ITO or ZnO. Other film partially absorbing the light may be a layer comprising Al, Cu, Au, Mo, Ni, Pt, Rh, Ag, W, Cr, Co, Si, Zr, Ta, INCONEL or NICHROME.

For forming the layer containing the organic compound 20 subsequently, description is to be made with reference to a light absorbing multi-layered film absorbing external light with a nitrogen-containing film. Simulation described below was conducted.

Figure 16:
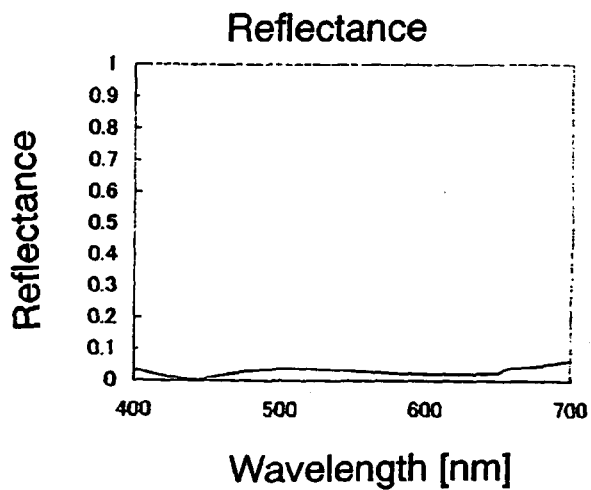
FIG. 16 is a result of simulation of a light absorbing multi-layered film.

FIG. 16 shows a result of determining the reflectance in a model structure obtained by successively laminating, on a film comprising aluminum as a main ingredient (100 nm thickness), a silicon nitride film (37 nm thickness) obtained by sputtering using a silicon target in an atmosphere containing nitrogen and argon, a titanium nitride film (66 nm thickness) and a silicon nitride film (37 nm thickness) obtained by sputtering using a silicon target in an atmosphere containing nitrogen and argon. Simulation was conducted while assuming the refractive index of the silicon nitride film as 2.04 to 2.2, the refractive index of the titanium nitride film as 1.67 to 2.35, and the refractive index of the aluminum film as 0.39 to 1.985 in a wavelength range from 300 nm to 800 nm. In a visible region, the average reflectance was 3%. The film thickness is not restricted particularly but may be set optionally. Further, the optimum film thickness changes also depending on the material.

Figure 17:
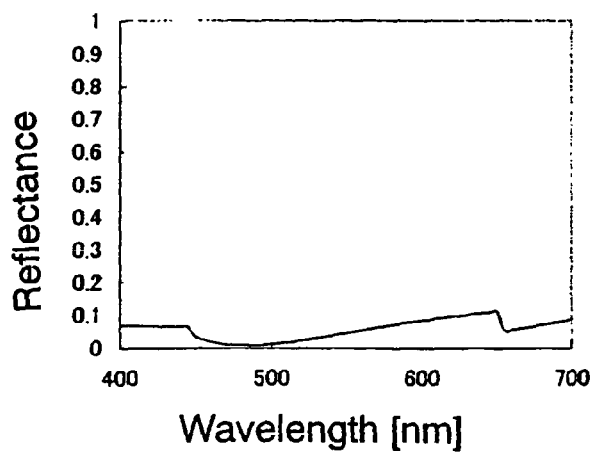
FIG. 17 is a result of simulation of a light absorbing multi-layered film.
Figure 18:
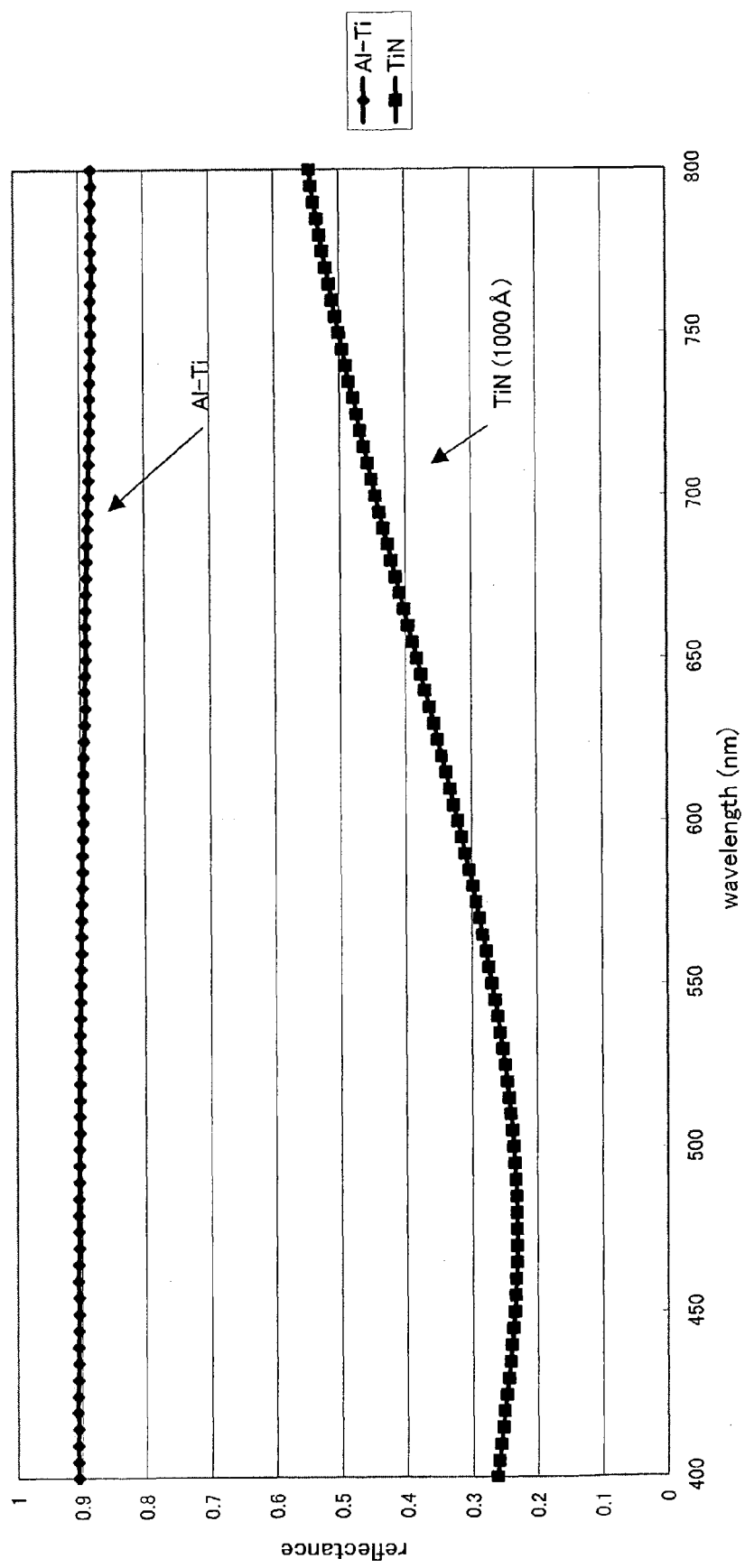
FIG. 18 is a diagram showing the reflectance of an Al—Ti film and a TiN film.

FIG. 17 shows the result obtained by similar simulation for a case covering with a second seal agent (described in Embodiment 3). While the reflectance increases somewhat compared with FIG. 16, it can be 6% in average. In a case of covering with the second seal agent, the optimum thickness of the silicon nitride film was 42 nm.

Further, while the example of laminating in the order of the silicon nitride film, the titanium nitride film and the silicon nitride film, it may be laminated in the order, for example, of the silicon nitride film, the tantalum nitride film and the silicon nitride film, or may be laminated in the order of the silicon nitride film, the titanium nitride film and the ITO film. Lamination in the order of the silicon nitride film, the titanium nitride film and the ITO film is preferred since this can take a larger margin of the process upon subsequent etching.

Further, it is possible to constitute all of the materials for the light absorbing multi-layered film with materials capable of being formed by sputtering, and form the first electrode and the light absorbing multi-layered film continuously without exposure to atmospheric air. Further, when a nitride film is used as the light absorbing multi-layered film 24, it can also function as a passivation film. Further, use of a nitride film for the light absorbing multi-layered film 24 can block water content or oxygen and it is suitable to a light emission element using a layer containing the organic compound 20.

To make the layer containing the organic compound 20 emit white light, an aqueous solution of poly(ethylene dioxythiophene)/poly(styrene sulfonic acid) (PEDOT/PSS) is applied to the entire surface and baked to form a film that works as a hole injection layer. Then, a polyvinyl carbazole (PVK) solution doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is applied to the entire surface and baked to form a film that works as a light emitting layer. The solvent of PEDOT/PSS is water and PEDOT/PSS is not dissolved in an organic solvent. Accordingly, the hole injection layer does not go back to the melted state when PVK is applied thereon. Since PEDOT/PSS and PVK have different solvents, they are preferably formed into films in different film forming chambers. The layer containing the organic compound 20 may instead be a single layer. In this case, a 1,3,4-oxadiazole derivative (PBD) capable of transporting electrons is dispersed in polyvinyl carbazole (PVK) capable of transporting holes. Another method to obtain white light emission is to disperse 30 wt % of PBD as an electron transporting agent and disperse four kinds of pigments (TPB, coumarin 6, DCM1, and Nile red) in appropriate amounts.

Alternatively, a combination of films is chosen appropriately from a film containing an organic compound that emits red light, a film containing an organic compound that emits green light, and a film containing an organic compound that emits blue light to overlap each other and mix their colors, thereby obtaining white light emission.

For the second electrode 21, a $CaF_2$ film is formed by evaporation to have a thickness of 1 to 10 nm and then an Al film is formed by sputtering or evaporation to have a thickness of about 10 nm to function as the cathode (or anode). The material and thickness of the cathode (or anode) have to be chosen suitably to transmit light from the layer containing the organic compound 20. In this specification, the term cathode includes not only a single layer of a material having a small work function but also a laminate of a thin film of a small work function material and a conductive film.

Using an Al film as the second electrode 21 means that a material that is not an oxide comes into contact with the layer containing the organic compound 20. As a result, the reliability of the light emitting device is improved. Instead of an Al film, a transparent conductive film (such as an ITO (indium oxide-tin oxide alloy) film, an $In_2O_3$—ZnO (indium oxide-zing oxide alloy) film, or a ZnO (zinc oxide) film) may be employed as the second electrode 21. The $CaF_2$ layer may be replaced by a thin metal layer (typically a film of such alloy as MgAg, MgIn, or AlLi).

Both end portions of the first electrode 18a-c and in-between areas are covered with an insulator 19 (also called as a barrier or a bank). In the present invention, what sectional shape the insulator 19 takes is important. By etching treatment using the insulator 19 as a mask the concave shape of the first electrode 18 is obtained. If an upper edge portion of the insulator 19 is not curved, a formation defect of a film which is formed on the insulator 19 is likely to occur. Therefore, the present invention uses etching treatment to make an upper edge portion of the insulator 19 curved to have a radius of curvature, to form a slope along the curved face partially exposing the upper layer 18c of the first electrode, and to expose the middle layer 18b of the first electrode in a region that serves as a light emitting region. The exposed surface of the middle layer 18b of the first electrode may be leveled by CMP or other treatment. The radius of curvature of the upper edge portion of the insulator 19 is preferably set to 0.2 to 3 µm. The present invention can give the layer containing the organic compound layer and the second electrode 21 to have excellent coverage. The taper angle in the side face of the insulator 19 is equal to the taper angle in the slope of the upper layer 18c of the first electrode, and is set to 55°±5°.

The present invention is characterized in that light emitted from the layer containing the organic compound 20 is reflected at the slope of the upper layer 18c of the first electrode to increase the total amount of light taken out in the direction indicated by the arrow in FIG. 1A.

Figure 1B:
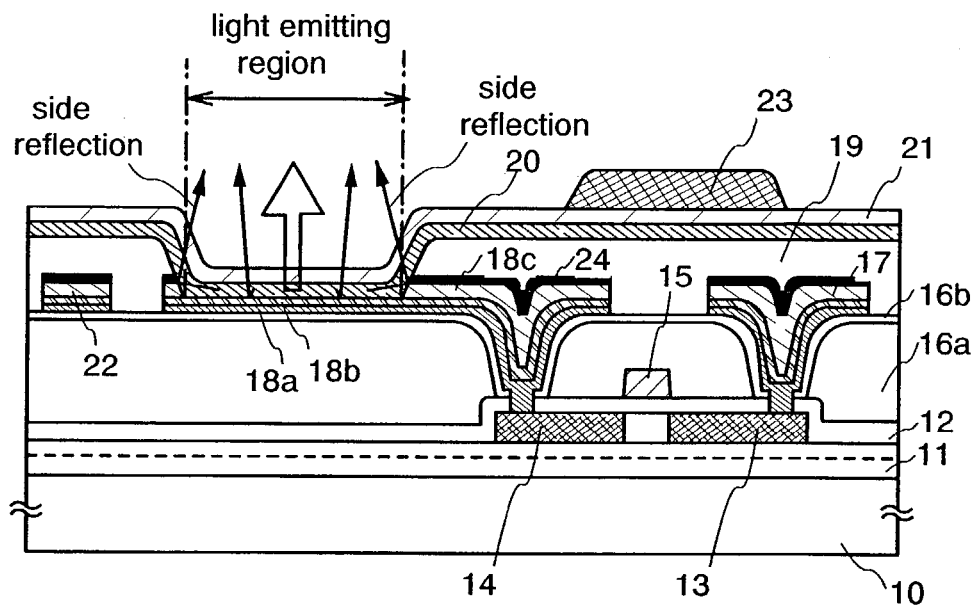

As shown in FIG. 1B, an auxiliary electrode 23 may be provided on the second electrode 21 in order to lower the resistance of the second electrode (cathode or anode) 21. The auxiliary electrode 23 is selectively formed by evaporation using an evaporation mask.

Although not shown in the drawing, a protective film is preferably formed on the second electrode 21 in order to enhance the reliability of the light emitting device. This protective film is an insulating film which mainly contains silicon nitride or silicon nitroxide and which is formed by sputtering (the DC method or the RF method), or a thin film mainly containing carbon. A silicon nitride film can be formed in an atmosphere containing nitrogen and argon using a silicon target. A silicon nitride target may be employed instead. The protective film may also be formed by film forming apparatus that uses remote plasma. The protective film is made as thin as possible to allow emitted light to pass through the protective film. The second electrode 21 (a cathode or an anode) is made from aluminum, it is highly capable of blocking moisture and oxygen.

The invention is characterized in that the thin film whose major component is carbon is constituted by a DLC (Diamond like Carbon) film having a film thickness of 3 through 50 nm. Although the DLC film is provided with $SP^3$ bond as a bond among carbon atoms in a short distance order, macroscopically, the DLC film is constituted by an amorphous-like structure. The composition of the DLC film is constituted by 70 through 95 atomic % of carbon and 5 through 30 atomic % of hydrogen and the DLC film is very hard and excellent in insulating performance. The DLC film is characterized in that permeability of gas of steam, oxygen or the like is low. Further, it is known that the DLC film is provided with a 15 through 25 GPa hardness by measurement by a very small hardness meter.

The DLC film can be formed by a plasma CVD method (representatively, RF plasma CVD method, microwave CVD method, electron cyclotron resonance (ECR) CVD method), or sputtering method. By using any of the film forming methods, the DLC film can be formed with excellent adherence. The DLC film is formed by installing a substrate at a cathode. Further, a dense and hard film can be formed by applying negative bias and utilizing ion bombardment to some degree.

As a reaction gas used in film forming, hydrogen gas and a hydrocarbon species gas (for example, $CH_4$, $C_2H_2$, $C_6H_6$ or the like) is used, the gas is ionized by glow discharge and the film is formed by accelerating and impacting ions to a cathode applied with negative self bias. Thereby, the dense and smooth DLC film can be provided. Further, the DLC film is an insulating film which is transparent or semitransparent for visible light.

In the specification, being transparent for visible light indicates that transmittance of visible light is 80 through 100% and being semitransparent for visible light indicates that transmittance of visible light is 50 through 80%.

Further, not shown in the drawings, EL element is enclosed by the substrate for sealing the EL element and a second seal agent. The seal substrate is pasted by the second seal agent to maintain an interval of about 2 through 30 µm and all of the light emitting elements are hermetically sealed. Degassing is preferably carried out by carrying out annealing in vacuum immediately before pasting the seal substrate by the second seal agent. All of the light emitting element is encapsulated by covering its whole surface using the second seal agent. It is preferable not to use drying agent. In case the seal substrate is pasted without using the second seal agent, space is formed between the substrate, then, a recessed portion is formed at the seal substrate by sand blast method or the like, and then, the recessed portion is arranged with the drying agent. Further, the pasting is preferably be carried out under an atmosphere including an inert gas (rare gas or nitrogen).

Further, although an explanation has been given here of the top gate type TFT as an example, the invention is applicable regardless of the TFT structure, for example, applicable to a bottom gate type (inverse stagger type) TFT or forward stagger type TFT.

Embodiment Mode 2

A method of combining a white color luminescent element and a color filter (hereinafter, referred to as color filter method) will be explained in reference to FIG. 5A as follows.

The color filter method is a system of forming a light emitting element having an layer containing an organic compound layer displaying white color luminescence and passing the provided white color luminescence through a color filter to thereby achieve luminescence of red, green, and blue.

Although there are various methods of achieving white color luminescence, a case of using a luminescent layer comprising a high molecular material formable by coating will be explained here. In this case, doping of a color pigment to the high molecular material for constituting a luminescent layer can be carried out by preparing a solution and can extremely easily be achieved in comparison with a vapor deposition method for carrying out common vapor deposition for doping a plurality of color pigments.

Specifically, after coating and baking an aqueous solution of poly (ethylenedioxythiophene)/poly (stylenesulfonic acid) (PEDOT/PSS) operated as a hole injecting layer over an entire face of an anode comprising a metal having large work function (Pt, Cr, W, Ni, Zn, Sn, In), thereafter coating and baking a polyvinyl carbazole (PVK) solution doped with a luminescent core pigment (1,1,4,4-tetraphenyl 1,3-butadience (TPB), 4-dicyanomethylene-2-methyl-6-(p-dimethylaminostyryl)-4H-pyran(DCM1), Nile red, coumarin 6 or the like) operating as the luminescent layer over the entire face, a cathode comprising a laminated layer of a thin film including metal having small work function (Li, Mg, Cs) and a transparent conductive film (ITO (indium oxide tin oxide alloy), indium oxide zinc oxide alloy ($In_2O_3$—ZnO), zinc oxide (ZnO) or the like) laminated thereabove is formed. Further, PEDOT/PSS uses water as a solvent and is not dissolved in an organic solvent. Therefore, even when PVK is coated thereabove, there is no concern of dissolving again. Further, kinds of solvents of PEDOT/PSS and PVK differ from each other and therefore, it is preferable that the same film forming chamber is not used therefor.

Further, although an example of laminating organic compound layers is shown in the above-described example, a single layer of a layer containing an organic compound can be constituted. For example, 1,3,4-oxadiazole derivative (PBD) having electron transporting performance may be dispersed in polyvinyl carbazole (PVK) having hole transporting performance. Further, white color luminescence is achieved by dispersing 30 wt % of PBD as an electron transporting agent and dispersing pertinent amounts of four kinds of color pigments (TPB, coumarin 6, DCM1, Nile red).

Further, the layer containing the organic compound layer is formed between the anode and the cathode and by recombining holes injected from the anode and electrons injected from the cathode at the layer containing the organic compound layer, white color luminescence is achieved in the layer containing the organic compound layer.

Further, it is also possible to achieve white color luminescence as a whole by pertinently selecting an layer containing an organic compound layer for carrying out red color luminescence, an layer containing an organic compound layer for carrying out green color luminescence, and an layer containing an organic compound layer for carrying out blue color luminescence, and laminating the films to mix color.

The layer containing the organic compound layer formed as described above can achieve white color luminescence as a whole.

By forming color filters respectively provided with the coloring layer (R) for absorbing other than red color luminescence, a coloring layer (G) for absorbing other than green color luminescence and the coloring layer (B) for absorbing other than blue color luminescence in a direction of carrying out white color luminescence by the layer containing the organic compound layer, white color luminescence from the light emitting element can respectively be separated to achieve red color luminescence, green color luminescence and blue color luminescence. Further, in the case of an active matrix type, a structure in which TFT is formed between the substrate and the color filter is constituted.

Further, starting from simplest stripe pattern, skewed mosaic alignment, triangular mosaic alignment, RGBG four pixels alignment or RGBW four pixels alignment can be used for the coloring layer (R, G, B).

A coloring layer for constituting a color filter is formed by using a color resist comprising an organic photosensitive material dispersed with a pigment. Further, chromaticity coordinates of white color luminescence are (x, y)=(0.34, 0.35). It is known that color reproducing performance as full color is sufficiently ensured.

Further, in this case, even when achieved luminescent color differs, the constitution is formed with all the layer containing the organic compound layers displaying white color luminescence and therefore, it is not necessary to form the layer containing the organic compound layer to coat to divide for each luminescent color. Further, a polarizer for a circularly polarized light for preventing mirror reflection is not particularly needed.

Next, a CCM (color changing mediums) method realized by combining a blue color light emitting element having a blue color luminescent organic compound film and a fluorescent color changing layer will be explained in reference to FIG. 5B.

According to the CCM method, the fluorescent color changing layer is excited by blue color luminescence emitted from the blue color luminescent element and color is changed by each color changing layer. Specifically, changing from blue color to red color by the color changing layer (B→R), changing from blue color to green color by the color changing layer (B→G) and changing from blue color to blue color by the color changing layer (B→B) (further, changing from blue color to blue color may not be carried out) are carried out to achieve red color, green color and blue color luminescence. Also in the case of the CCM method, the structure in which TFT is formed between the substrate and the color changing layer is constituted in the case of the active matrix type.

Further, also in this case, it is not necessary to form the layer containing the organic compound layers to coat to divide also in this case. Further, a polarizer for a circularly polarized light for preventing mirror reflection is not particularly needed.

Further, when the CCM method is used, since the color changing layer is florescent, the color changing layer is excited by external light and a problem of reducing contrast is posed and therefore, as shown by FIG. 5C, the contrast may be made conspicuous by mounting color filters. In this case, blue color luminescence is not necessary, instead, white color luminescence may be used.

Further, this embodiment mode can be combined with Embodiment Mode 1.

Embodiment Mode 3

Other example of the structure is to be described with reference to FIG. 4. Since the embodiment in FIG. 4 is identical with the embodiment of FIG. 2 except for a certain portion, identical portions carry same reference numerals.

Figure 4:
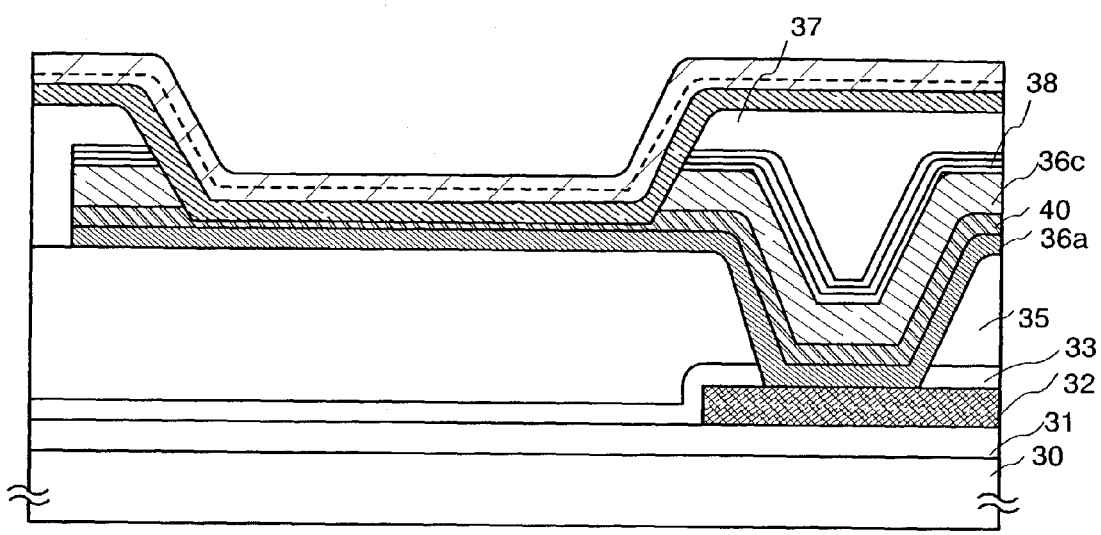
FIG. 4 is a diagram showing an Embodiment Mode 3.

In FIG. 4, after laminating a titanium nitride film 40 on a titanium film 36a to a thickness slightly larger than that of FIG. 2, a portion of the titanium nitride film 40 is also formed as an inclined surface by etching. Since other structures are identical with those in FIG. 2, detailed descriptions of them will be omitted.

Further, this embodiment mode can be optionally combined with Embodiment Mode 1 or Embodiment Mode 2.

The present invention comprising the foregoing constitutions is to be described more specifically with reference to examples described below.

Embodiment 1

In this embodiment, a brief description is given with reference to FIGS. 2A to 3C on an example of procedure of forming a light emitting element in accordance with the present invention.

First, a base insulating film 31 is formed on a substrate 30 which has an insulating surface.

The base insulating film 31 is a laminate and the first layer is a silicon oxynitride film formed to have a thickness of 10 to 200 nm (preferably 50 to 100 nm) by plasma CVD using as reaction gas $SiH_4$, $NH_3$, and $N_2O$. Here, a silicon oxynitride film (composition ratio: Si=32%, O=27%, N=24%, H=17%) with a thickness of 50 nm is formed. The second layer of the base insulating film is a silicon oxynitride film formed to have a thickness of 50 to 200 nm (preferably 100 to 150 nm) by plasma CVD using as reaction gas $SiH_4$ and $N_2O$. Here, a silicon oxynitride film (composition ratio: Si=32%, O=59%, N=7%, H=2%) with a thickness of 100 nm is formed. Although the base insulating film 108 in this embodiment has a two-layer structure, a single layer or a laminate of more than two layers of the above insulating films may be employed instead.

Next, a semiconductor layer is formed on the base film. The semiconductor layer to serve as an active layer of the TFT is obtained by forming a semiconductor film that has an amorphous structure through a known method (sputtering, LPCVD, plasma CVD, or the like), subjecting the film to known crystallization treatment (laser crystallization, thermal crystallization, thermal crystallization using nickel or other catalysts, or the like), and then patterning the obtained crystalline semiconductor film into a desired shape. The thickness of the semiconductor layer is set to 25 to 80 nm (preferably 30 to 60 nm). The material of the crystalline semiconductor film is not limited but preferably is silicon, a silicon germanium alloy, or the like.

When laser crystallization is employed to form the crystalline semiconductor film, a pulse oscillation type or continuous wave excimer layer, YAG layer, or $YVO_4$ laser is used. Laser light emitted from one of such laser oscillators is collected by an optical system into a linear shape before irradiating the semiconductor film. Crystallization conditions are chosen to suit individual cases. However, when an excimer layer is employed, the pulse oscillation frequency is set to 30 Hz and the laser energy density is set to 100 to 400 $mJ/cm^2$ (typically 200 to 300 $mJ/cm^2$). When a YAG laser is employed, the second harmonic thereof is used, the pulse oscillation frequency is set to 1 to 10 kHz, and the laser energy density is set to 300 to 600 $mJ/cm^2$ (typically 350 to 500 $mJ/cm^2$). The laser light is collected to have a width of 100 to 1000 μm, for example, 400 μm, into a linear shape and the entire surface of the substrate is irradiated with this linear laser light setting the laser light overlap ratio to 80 to 98%.

Next, the surface of the semiconductor layer is washed with an etchant containing hydrofluoric acid to form a gate insulating film 33 that covers the semiconductor layer. The gate insulating film 33 is an insulating film containing silicon and is formed by plasma CVD or sputtering to have a thickness of 40 to 150 nm. In this embodiment, a silicon oxynitride film (composition ratio: Si=32%, O=59%, N=7%, H=2%) is formed by plasma CVD to have a thickness of 115 nm. The gate insulating film 33 is not limited to the silicon oxynitride film, of course, but may be a single layer or laminate of other insulating films that contain silicon.

The surface of the gate insulating film 33 is washed and then a gate electrode (not shown) is formed.

Next, the semiconductor layer is appropriately doped with an impurity element that imparts a semiconductor the p type conductivity, here, boron (B), to form a source region 32 and a drain region 32. After the doping, the semiconductor layer is subjected to heat treatment, irradiation of intense light, or laser light irradiation in order to activate the impurity element. At the same time the impurity element is activated, plasma damage to the gate insulating film 33 and plasma damage to the interface between the gate insulating film 33 and the semiconductor layer are repaired. It is particularly effective to activate the impurity element by irradiating the substrate from the front or back with the second harmonic of a YAG laser at room temperature to 300° C. A YAG laser is a preferable activation measure because it requires little maintenance.

Figure 3A:
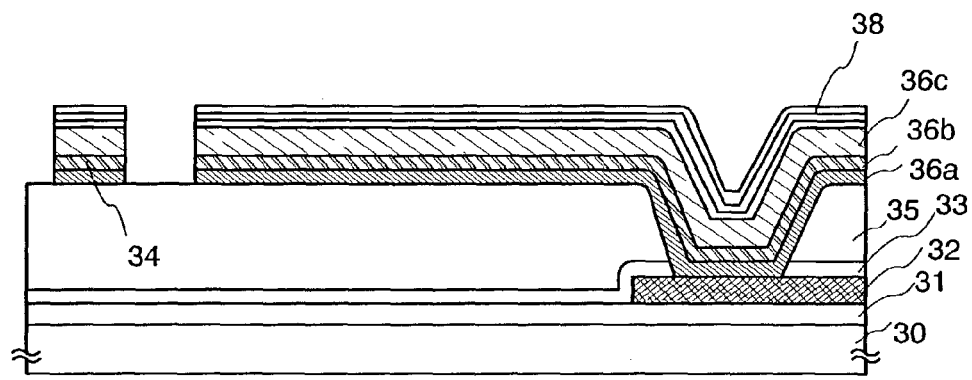
FIGS. 3A to 3C are diagrams showing an Embodiment 1.

The subsequent steps include forming an interlayer insulating film 35 from an organic or inorganic material (an applied silicon oxide film, PSG (phosphorus-doped glass), BPSG (glass doped with boron and phosphorus), or the like), hydrogenating the semiconductor layer, and forming contact holes reaching the source region or drain region. Then, a source electrode (wiring) 34 and a first electrode (drain electrode) 36a-c, are formed to complete the TFT (p-channel TFT). Then a light absorbing multi-layered film 38 is formed (FIG. 3A).

Although the description in this embodiment uses a p-channel TFT, an n-channel TFT can be formed if an n type impurity element (such as P or As) is used instead of a p type impurity element.

The description given in this embodiment takes a top gate TFT as an example. However, the present invention is applicable to any TFT structure. For instance, the invention can be applied to a bottom gate (reverse stagger) TFT and a forward stagger TFT.

The layers 36a to 36c of the first electrode in this embodiment are each a film mainly containing an element selected from the group consisting of Ti, TiN, $TiSi_xN_y$, Al, Ag, Ni, W, $WSi_x$, $WN_x$, $WSi_xN_y$, Ta, $TaN_x$, $TaSi_xN_y$, NbN, MoN, Cr, Pt, Zn, Sn, In, and Mo, or a film mainly containing an alloy or compound material of the above elements, or a laminate of these films. The total thickness of the layers 36a to 36c is set between 100 nm and 800 nm.

Particularly, the lower layer 36a of the first electrode that comes into contact with the drain region 32 is preferably formed of a material that can form an ohmic contact with silicon, typically titanium, and is given a thickness of 10 to 100 nm. For the middle layer 36b of the first electrode, a material that has a large work function when formed into a thin film (TiN, Pt, Cr, W, Ni, Zn, Sn) is preferred in case of using the first electrode as an anode, and the thickness of the layer is set to 10 to 100 nm. When using TiN as a middle layer 36b of the first electrode, it is preferable to irradiate ultraviolet light to large the work function of TiN. For the layer 36c of the first electrode, a metal material reflective of light, typically, a metal material mainly containing Al or Ag, is preferred, and the thickness of the layer is set to 100 to 600 nm. The middle layer 36b of the first electrode also functions as a blocking layer for preventing the upper layers 36c and the lower layer 36a of the first electrode from forming an alloy. The light absorbing multi-layered film 38 is preferable to be formed by stacking a silicon nitride film (37 nm in thick), a metal nitride film (for example, TiN, TaN, or the like) (66 nm in thick), and a silicon nitride film (37 nm in thick). For the light absorbing multi-layered film 38, a material capable of preventing oxidation and corrosion of the upper layer 36c of the first electrode and avoiding hillock is preferred.

The first electrode 36a-c can be formed at the same time other wirings, for example, a source wiring 34 and a power supplying line, are formed. Accordingly, the process needs fewer photomasks (seven masks in total: a patterning mask for the semiconductor layer (Mask 1), a patterning mask for the gate wiring (Mask 2), a doping mask for selective doping by an n type impurity element (Mask 3), a doping mask for selective doping by a p type impurity element (Mask 4), a mask for forming contact holes that reach the semiconductor layer in the interlayer insulating film (Mask 5), a patterning mask for the first electrode, the source wiring, and the power supplying line (Mask 6), and a mask for forming an insulator (Mask 7)). Conventionally, the first electrode is formed on a layer different from the one where the source wiring and the power supplying line are formed and therefore a mask for forming the first electrode alone is needed, thus making the number of masks required 8 in total. When the layers 36a to 36c of the first electrode and the wirings are formed at the same time, it is desirable to set the total wiring electric resistance low.

Figure 3B:
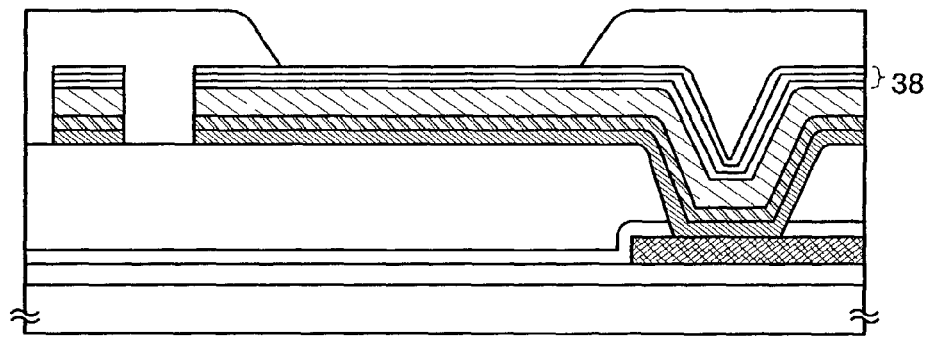

Next, the insulator 37 (called as a bank, a partition wall, a barrier, or the like) is formed to cover the edge of the first electrode (and a portion that is in contact with the drain region 32) (FIG. 3B). The light absorbing multi-layered film 38 is formed on the first electrode 36a-c to absorb the external light. The insulator 37 is a film or a laminate of inorganic materials (such as silicon oxide, silicon nitride, and silicon oxynitride) and photosensitive or non-photosensitive organic materials (such as polyimide, acrylic, polyamide, polyimide-amide, resist, and benzocyclobutene). Photosensitive organic resin is used in this embodiment. If positive photosensitive acrylic is used as a material of the insulator 37, for example, it is preferable to curve only an upper edge portion of the insulator 37 to give a radius of curvature. A negative photosensitive material which becomes insoluble in an etchant under light and a positive photosensitive material which becomes soluble in an etchant under light both can be used for the insulator 37.

Figure 3C:
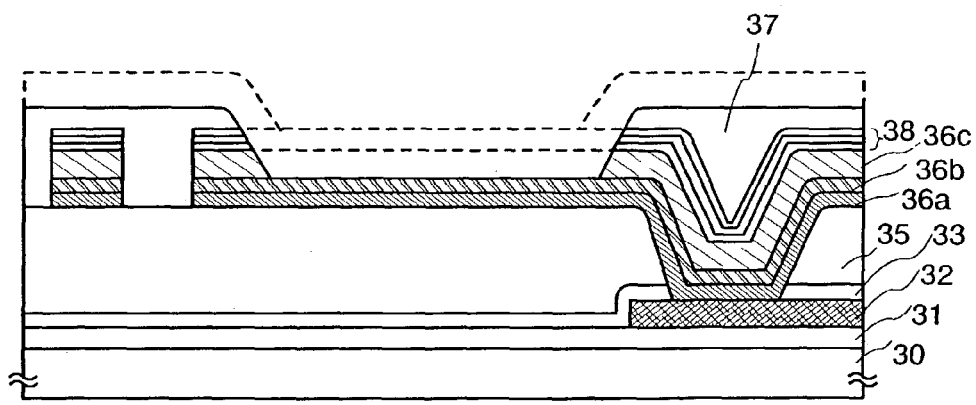

The insulator 37 is etched as shown in FIG. 3C and, simultaneously, the upper layers 36c of the first electrode and the light absorbing multi-layered film 38 are partially removed. It is important to etch the films such that a slope is formed in the exposed face of the upper layer 36c of the first electrode and the middle layer 36b of the first electrode obtains a flat exposed face. This etching uses dry etching or wet etching, and is finished in one step or divided into several steps. Etching conditions that make the selective ratio between the middle layer 36b of the first electrode and the upper layer 36c of the first electrode high are chosen. Preferably, the final radius of curvature of the upper edge portion of the insulator 37 is 0.2 to 3 µm. The final angle of upper layer 36c of the first electrode (the angle of inclination or taper angle) is larger than 30° and smaller than 70° and, more preferably, 54.7°, so that the slope reflects light emitted from a layer containing an organic compound which is formed later.

Figure 2A:
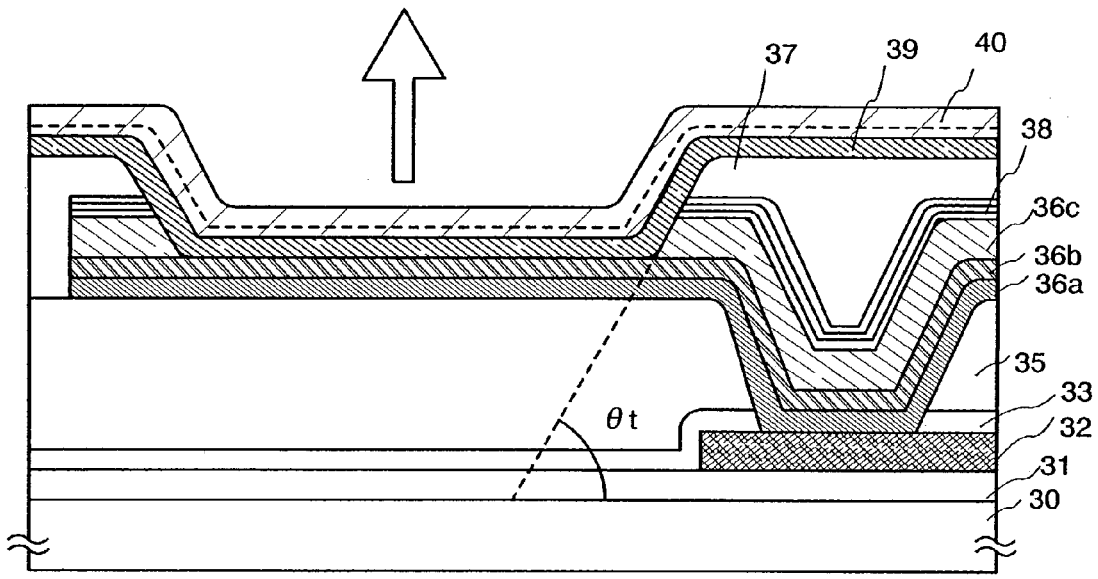
Figure 2B:
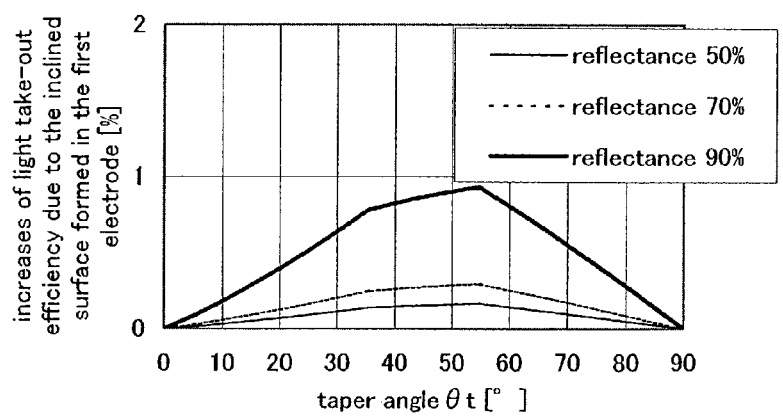
FIG. 2B is a result of simulation.

Next, a layer containing an organic compound 39 is formed by evaporation or application (FIG. 2A). When evaporation is chosen, for example, a film forming chamber is vacuum-exhausted until the degree of vacuum reaches $5\times10^{-3}$ Torr (0.665 Pa) or less, preferably $10^{-4}$ to $10^{-6}$ Pa, for evaporation. Prior to evaporation, the organic compound is vaporized by resistance heating. The vaporized organic compound flies out to the substrate as the shutter is opened for evaporation. The vaporized organic compound flies upward and then deposits on the substrate through an opening formed in a metal mask. Layers of the layer containing the organic compound are formed by evaporation so that the light emitting element as a whole emits white light.

For instance, an $Alq_3$ film, an $Alq_3$ film partially doped with Nile red which is a red light emitting pigment, an $Alq_3$ film, a p-EtTAZ film, and a TPD (aromatic diamine) film are layered in this order to obtain white light.

On the other hand, when the layer containing the organic compound is formed by application using spin coating, the layer after application is preferably baked by vacuum heating. For example, an aqueous solution of poly(ethylene dioxythiophene)/poly(styrene sulfonic acid) (PEDOT/PSS) is applied to the entire surface and baked to form a film that works as a hole injection layer. Then, a polyvinyl carbazole (PVK) solution doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is applied to the entire surface and baked to form a film that works as a light emitting layer.

Although the layer containing the organic compound is a laminate in the above example, a single-layer film may be used as the layer containing the organic compound. For instance, a 1,3,4-oxadiazole derivative (PBD) capable of transporting electrons is dispersed in polyvinyl carbazole (PVK) capable of transporting holes. Another method to obtain white light emission is to disperse 30 wt % of PBD as an electron transporting agent and disperse four kinds of pigments (TPB, coumarin 6, DCM1, and Nile red) in appropriate amounts. Also, the layer containing the organic compound may be a laminate of layers of high molecular weight material and layers of low molecular weight materials.

The next step is to form a thin film containing a metal of small function (a film of an alloy such as MgAg, MgIn, AlLi, $CaF_2$, or CaN, or a film formed by co-evaporation of an element belonging to Group 1 or 2 in the periodic table and aluminum) and to form a thin conductive film (an aluminum film here) thereon by evaporation, and obtaining a second electrode 40 (a cathode) (FIG. 2A). An aluminum film is highly capable of blocking moisture and oxygen and therefore is a preferable material of the second electrode 40 (cathode) for improvement of the reliability of the light emitting device. The second electrode 40 (a cathode) is thin enough to let emitted light pass and functions as the cathode in this embodiment. The thin conductive film may be replaced by a transparent conductive film (such as an ITO (indium oxide-tin oxide alloy) film, an $In_2O_3$—ZnO (indium oxide-zing oxide alloy) film, or a ZnO (zinc oxide) film). On the second electrode 40 (a cathode), an auxiliary electrode may be formed in order to lower the resistance of the second electrode 40 (a cathode). The second electrode 40 (a cathode) is formed selectively by resistance heating through evaporation using an evaporation mask.

The thus obtained light emitting element emits white light in the direction indicated by the arrow in FIG. 2A. Light emitted in the lateral direction is reflected by the slope in the upper layer 36c of the first electrode, thereby increasing the amount of light emitted in the arrow direction. The reflected light of electrodes and wirings can be suppressed since the external light is absorbed by the light absorbing multi-layered film 38 provided on the first electrode 36a-c.

After the manufacturing process is thus finished up through formation of the second electrode 40 (a cathode), the light emitting element formed on the substrate 30 is sealed by bonding a sealing substrate (transparent substrate) using a first seal agent. Spacers formed from a resin film may be provided in order to keep the gap between the sealing substrate and the light emitting element. The space surrounded by the first seal agent is filled with nitrogen or other inert gas. For the seal agent, an epoxy-based resin is preferred. Desirably, the material of the first seal agent transmits as little moisture and oxygen as possible. A substance having an effect of absorbing oxygen and moisture (e.g., drying agent) may be placed in the space surrounded by the seal agent.

By enclosing the light emitting element in a space as above, the light emitting element can be completely cut off from the outside and external substances that accelerate degradation of the layer containing the organic compound, such as moisture and oxygen, can be prevented from entering the light emitting element. Accordingly, a highly reliable light emitting device is obtained.

Embodiment 2

This embodiment describes with reference to FIGS. 6A to 8 an example of a light emitting device in which an auxiliary electrode is formed.

Figure 6A:
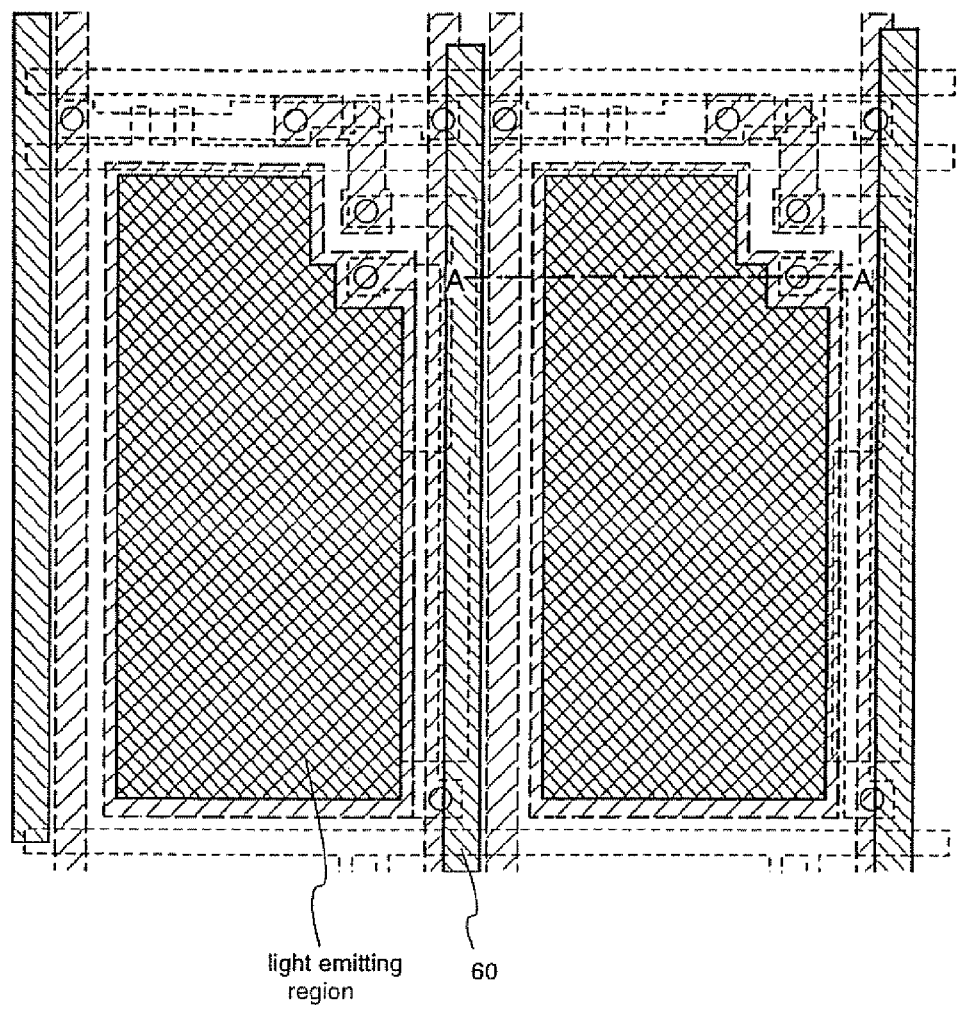
FIGS. 6A and 6B are diagrams showing an Embodiment 2.
Figure 6B:
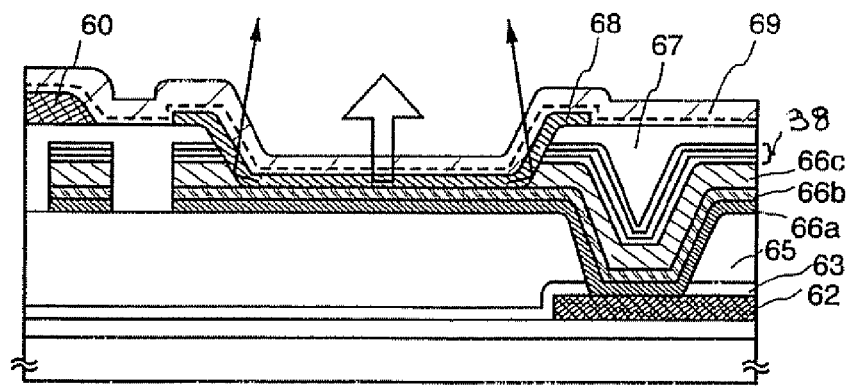

FIG. 6A is a top view of a pixel and a sectional view taken along the dot-dash line A-A' is FIG. 6B.

In this embodiment, steps up through formation of an insulator 67 are identical with those in Embodiment 1 and descriptions thereof are omitted here. The insulator 37 in FIG. 2B corresponds to the insulator 67 in FIG. 6B.

Following the descriptions in Embodiment 1, a base insulating film, a drain region 62, a gate insulating film 63, an interlayer insulating film 65, layers 66a-c of a first electrode, a light absorbing multi-layered film 38, and the insulator 67 are formed on a substrate having an insulating surface.

Next, a layer containing an organic compound 68 is selectively formed. This embodiment employs evaporation using an evaporation mask or ink jet to selectively form the layer containing the organic compound 68.

Figure 7:
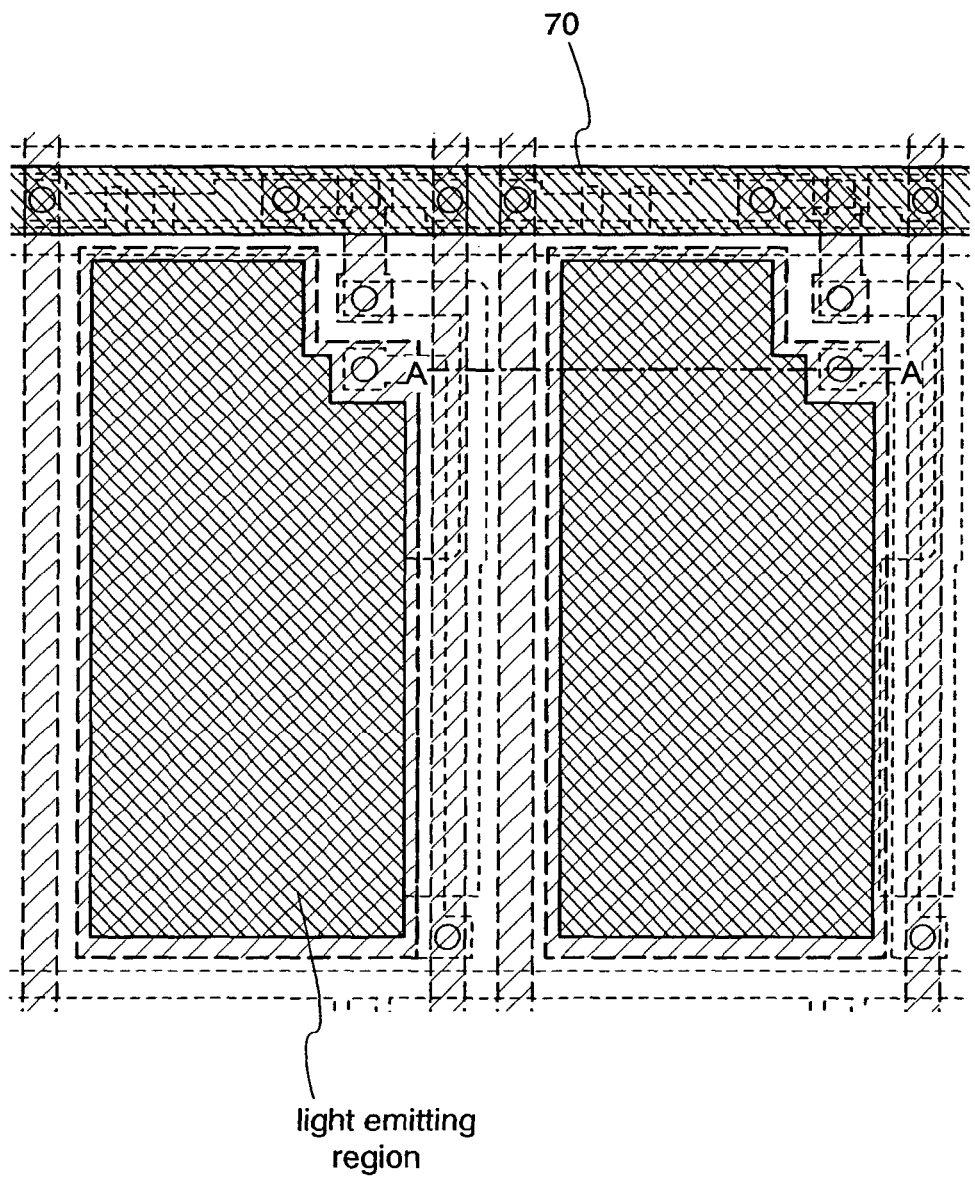
FIG. 7 is a diagram showing an Embodiment 2.

Then, an auxiliary electrode 60 is selectively formed on the insulator 67 by evaporation using an evaporation mask. The thickness of the auxiliary electrode 60 is set to 0.2 to 0.5 μm. In the example given in this embodiment, the auxiliary electrode 60 is placed in the direction Y as shown in FIG. 6A. However, arrangement of the auxiliary electrode is not particularly limited and, as shown in FIG. 7, an auxiliary electrode 70 placed in the direction X may be employed. A sectional view taken along the dot-dash line A-A' in FIG. 7 is identical with FIG. 2A.

Figure 8:
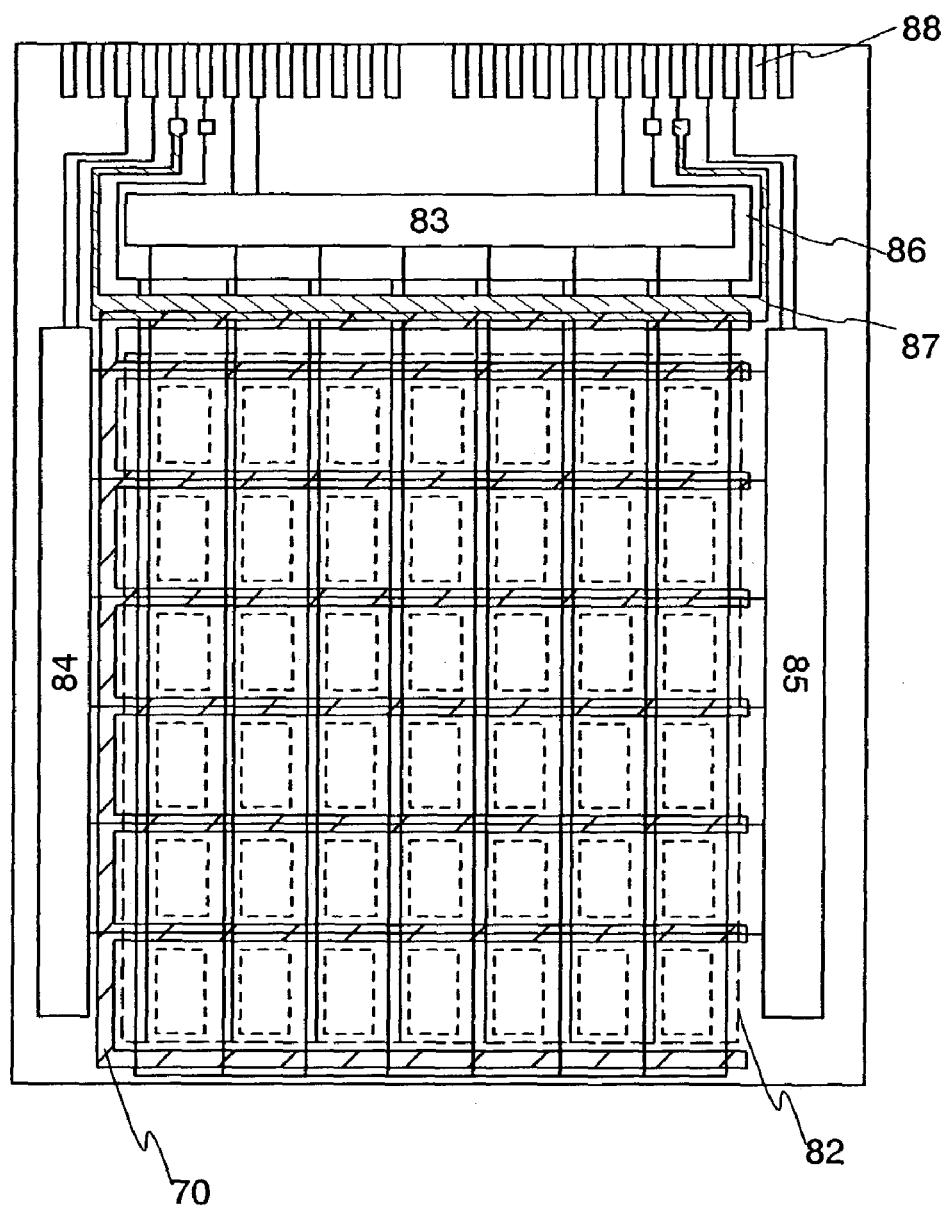
FIG. 8 is a diagram showing an Embodiment 2.

FIG. 8 is an exterior diagram of the panel shown in FIG. 7. The auxiliary electrode (auxiliary wiring) 70 is led out as shown in FIG. 8 and comes into contact with a lead-out wiring 87 in a region between a pixel portion 82 and a source side driving circuit 83. In FIG. 8, reference symbol 82 denotes the pixel portion, 83, the source side driving circuit, 84 and 85, gate side driving circuits, and 86, a power supplying line. The wirings that are formed at the same time the first electrode is formed are the power supplying line 86, the lead-out wiring 87, and a source wiring. In FIG. 8, a terminal electrode 88 for connecting with an FPC is formed at the same time a gate wiring is formed.

Similarly to Embodiment 1, the next step is to form a thin film containing a metal of small function (a film of an alloy such as MgAg, MgIn, AlLi, $CaF_2$, or CaN, or a film formed by co-evaporation of an element belonging to Group 1 or 2 in the periodic table and aluminum) and to form a second electrode 69 (a thin aluminum film here) thereon by evaporation. This second electrode 69 is thin enough to let emitted light pass and functions as the cathode in this embodiment. The thin aluminum film may be replaced by a transparent conductive film (such as an ITO (indium oxide-tin oxide alloy) film, an $In_2O_3$—ZnO (indium oxide-zing oxide alloy) film, or a ZnO (zinc oxide) film). In this embodiment, the auxiliary electrode 60 is formed on the insulator 67 such that the auxiliary electrode 60 comes into contact with the second electrode 69 (cathode) in order to lower the resistance of the second electrode 69 (cathode).

The thus obtained light emitting element emits white light in the direction indicated by the arrow in FIG. 6B. Light emitted in the lateral direction is reflected by the slope in the upper layer 66c of the first electrode, thereby increasing the amount of light emitted in the arrow direction. The reflected light of electrodes and wirings can be suppressed since the external light is absorbed by the light absorbing multi-layered film 38 provided on the first electrode 66c.

This embodiment is also applicable to a light emitting device having a large-sized pixel portion since the resistance of the second electrode 69 (cathode) is lowered by forming the auxiliary electrode 60 or 70.

In the example shown in this embodiment, the auxiliary electrode 60 is formed after the layer containing the organic compound 68 is formed. However, in what order they are formed is not particularly limited and the layer containing the organic compound may be formed after the auxiliary electrode 60 is formed.

This embodiment can be combined freely with any one of Embodiment Modes 1 through 3 and Embodiment 1.

Embodiment 3

Figure 9A:
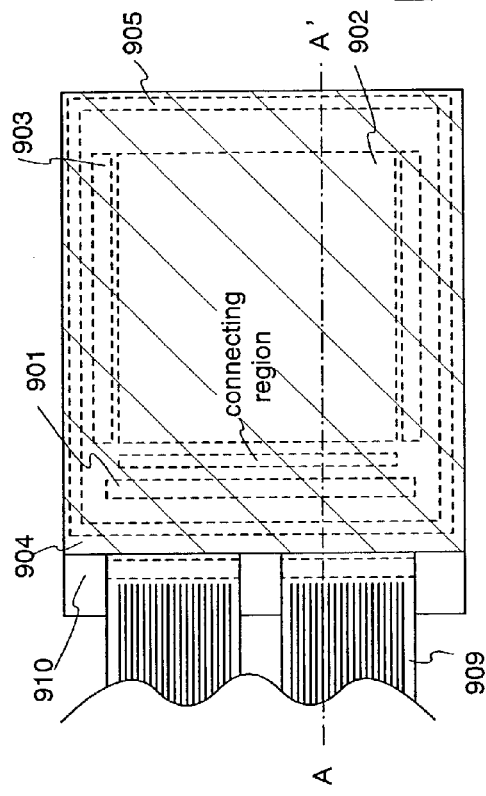
FIGS. 9A and 9B are diagrams showing an Embodiment 3.
Figure 9B:
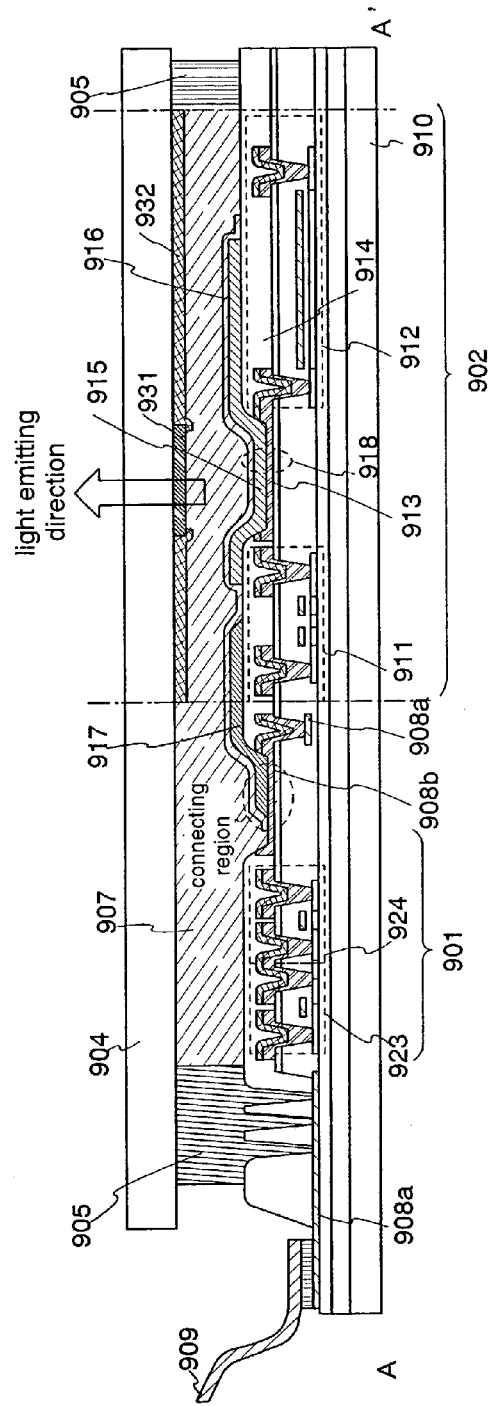

Further, an exterior view of an active matrix type light emitting apparatus is described with reference to FIG. 9. Further, FIG. 9A is a top view showing the light emitting apparatus and FIG. 9B is a cross-sectional view of FIG. 9A taken along a line A-A'. Reference numeral 901 indicated by a dotted line designates a source signal line driver circuit, numeral 902 designates a pixel portion, and numeral 903 designates a gate signal line driver circuit. Further, numeral 904 designates a seal substrate, numeral 905 designates a first seal agent and an inner side surrounded by the first seal agent 905 constitutes a second agent 907.

Further, reference numeral 908a, b designates a wiring for transmitting signals inputted to the source signal line driver circuit 901 and the gate signal line driver circuit 903 for receiving a video signal or a clock signal from FPC (flexible printed circuit) 909 for constituting an external input terminal. Further, although only FPC is illustrated here, the FPC may be attached with a printed wiring board (PWB). The light emitting apparatus in the specification includes not only a main body of the light emitting apparatus but also a state in which FPC or PWB is attached thereto.

Next, a sectional structure will be explained in reference to FIG. 9B. Driver circuits and the pixel portion are formed over a substrate 910 and here, the source signal line driver circuit 901 as the driver circuit and the pixel portion 902 are shown.

Further, the source signal line driver circuit 901 is formed with a CMOS circuit combined with an n-channel type TFT 923 and a p-channel type TFT 924. Further, TFT for forming the driver circuit may be formed by a publicly known CMOS circuit, PMOS circuit or NMOS circuit. Further, although according to the embodiment, a driver integrated type formed with the driver circuits over the substrate is shown, the driver integrated type is not necessarily be needed and the driver circuits can be formed not over the substrate but at outside thereof.

Further, the pixel portion 902 is formed by a plurality of pixels each including a switching TFT 911, a current control TFT 912, and a first electrode 913 (anode) electrically connected to a drain of the current control TFT 912.

Further, an insulator 914 is formed at both ends of the first electrode 913 (anode), a portion of the first electrode forms a slope along a side of the insulator 914. The slope of the first electrode is formed at the same time of a formation of the insulator 914. Light generated at a layer containing organic compound 915 is reflected by the slope in order to increase an amount of luminescence in the direction indicated by an arrow in FIG. 9B. The reflected light of electrodes and wirings can be suppressed since the external light is absorbed by the light absorbing multi-layered film (not shown) provided on wirings and electrodes.

The layer containing an organic compound 915 is selectively formed on the first electrode 913 (anode). Further, a second electrode 916 (cathode) is formed over the layer containing the organic compound 915. Thereby, a light emitting element 918 comprising the first electrode 913 (anode), the layer containing the organic compound 915 and the second electrode 916 (cathode) is formed. Here, the light emitting element 918 shows an example of white color luminescence and therefore, provided with the color filter comprising a coloring layer 931 and BM932 (for simplification, overcoat layer is not illustrated here).

An auxiliary electrode 917 which is a part of a structure shown in Embodiment 2 is formed on the insulator 914 to realize that the second electrode 916 has a lower resistance. The second electrode 916 (cathode) functions also as a wiring common to all the pixels and electrically connected to FPC 909 via the auxiliary electrode 917 and the connection wiring 908a b.

Further, in order to seal the light emitting element 918 formed over the substrate 910, the seal substrate 904 is pasted by the first seal agent 905. Further, a spacer comprising a resin film may be provided for ensuring an interval between the seal substrate 904 and the light emitting element 918. Further, the inner side of the first seal agent 905 is filled with a second seal agent 907. Further, it is preferable to use epoxy species resin for the first seal agent 905. Further, it is preferable that the first seal agent 905 is a material for permeating moisture or oxygen as less as possible.

Further, according to this embodiment, as a material for constituting the seal substrate 904, other than glass substrate or quartz substrate, a plastic substrate comprising FRP (Fiberglass-Reinforced Plastics), PVF (polyvinyl fluoride), Mylar, polyester or acrylic resin can be used. Further, it is possible to adhere the seal substrate 904 by using the first seal agent 905 and thereafter seal to cover a side face (exposed face) by a seal agent.

By sealing the light emitting element using the second seal agent 907 as described above, the light emitting element can completely be blocked from outside and a substance for expediting to deteriorate the layer containing the organic compound such as moisture or oxygen can be prevented from invading from outside. Therefore, the highly reliable light emitting apparatus can be provided.

Further, this embodiment can freely be combined with Embodiment Modes 1 to 3, and Embodiments 1, 2.

Embodiment 4

By implementing the present invention, all of electronic apparatus integrated with a module having an organic light emitting element (active matrix type EL module) are completed.

As such electronic apparatus, a video camera, a digital camera, a head mount display (goggle type display), a car navigation apparatus, a projector, a car stereo, a personal computer, a portable information terminal (mobile computer, portable telephone or electronic book) and the like are pointed out. FIGS. 10 and 11 show examples of these.

FIG. 10A is a personal computer which includes a main body 2001, an image input portion 2002, a display portion 2003 and a keyboard 2004.

FIG. 10B is a video camera which includes a main body 2101, a display portion 2102, a voice input portion 2103, an operation switch 2104, a battery 2105, an image receiving portion 2106.

FIG. 10C is a mobile computer which includes a main body 2201, a camera portion 2202, an image receiving portion 2203, an operation switch 2204 and a display portion 2205.

FIG. 10D is a goggle type display which includes a main body 2301, a display portion 2302 and an arm portion 2303.

FIG. 10E is a player using a record medium recorded with programs (hereinafter, referred to as record medium) which includes a main body 2401, a display portion 2402, a speaker portion 2403, a record medium 2404 and an operation switch 2405. Further, the player uses DVD (Digital Versatile Disc) or CD as a record medium and can enjoy music, enjoy movie and carry out the game or Internet.

FIG. 10F is a digital camera which includes a main body 2501, a display portion 2502, an eye-piece portion 2503, an operation switch 2504 and an image receiving portion (not illustrated).

Figure 11A:
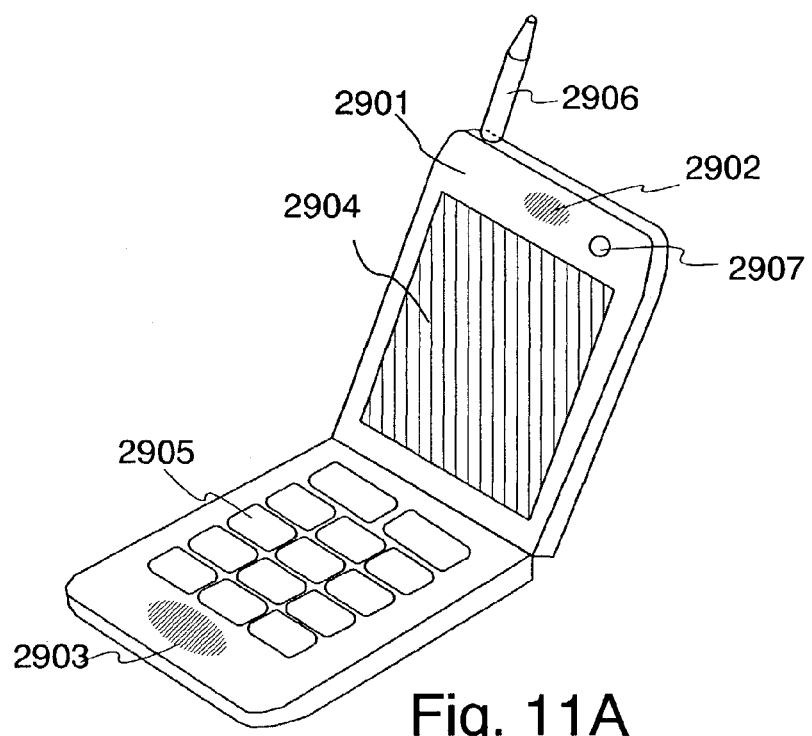
FIGS. 11A to 11C are diagrams showing examples of electronic apparatuses.

FIG. 11A is a portable telephone which includes a main body 2901, a voice output portion 2902, a voice input portion 2903, a display portion 2904, an operation switch 2905, an antenna 2906 and an image input portion (CCD, image sensor) 2907.

Figure 11B:
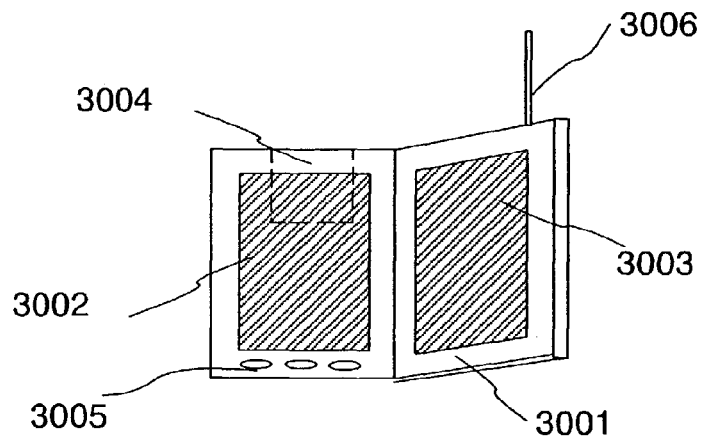

FIG. 11B is a portable book (electronic book) which includes a main body 3001, display portions 3002, 3003, a record medium 3004, an operation switch 3005, an antenna 3006.

Figure 11C:
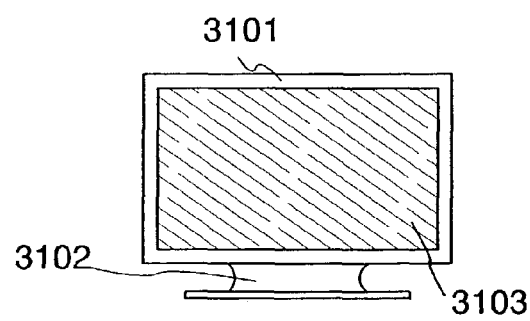
Figure 12:
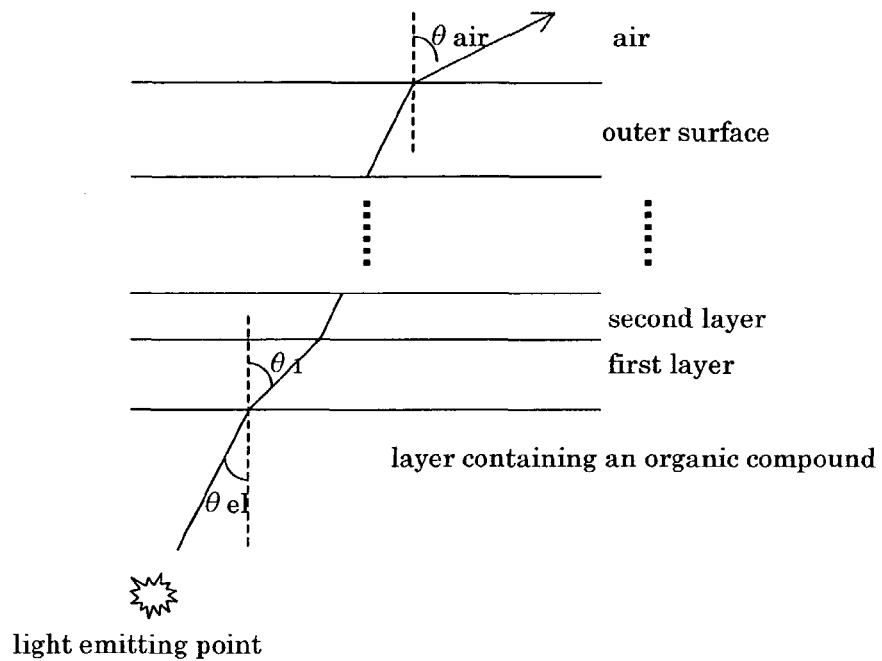
FIG. 12 is a model diagram used in simulation.
Figure 13:
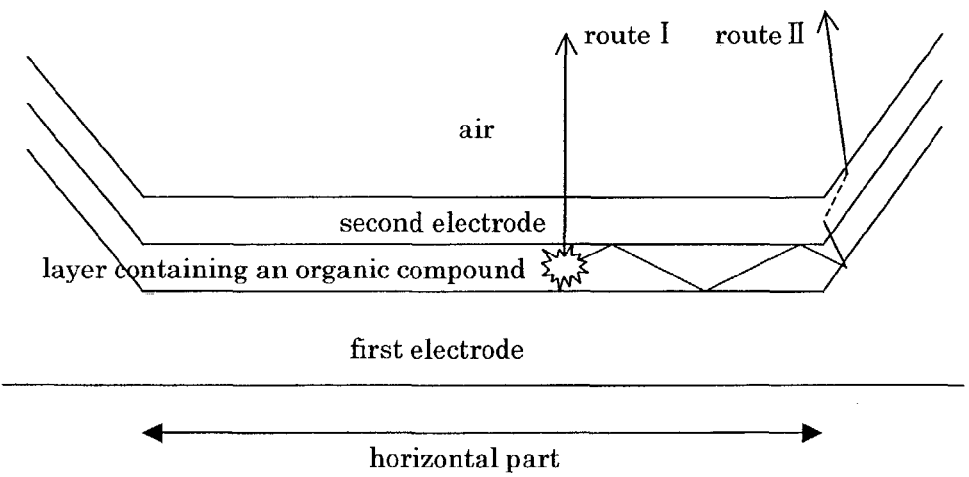
FIG. 13 is a model diagram used in simulation.
Figure 14:
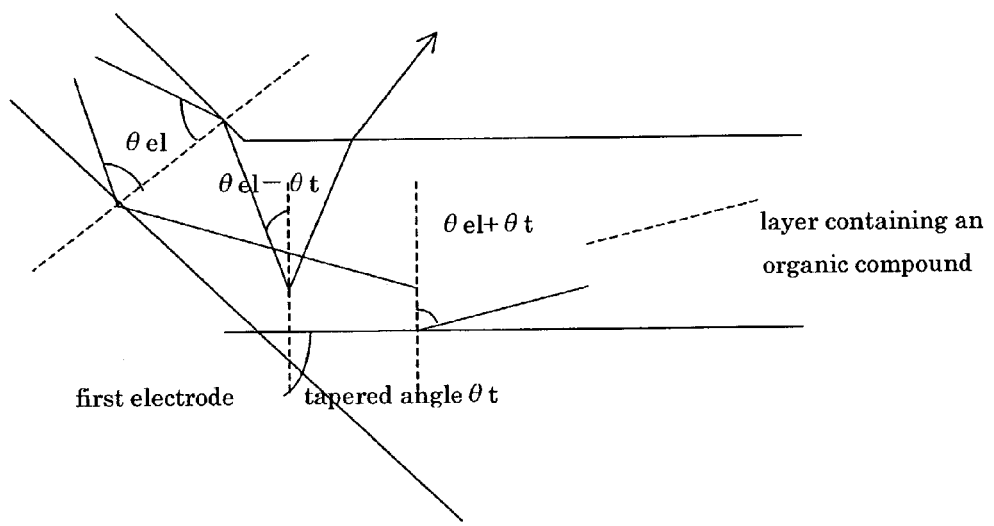
FIG. 14 is a model diagram used in simulation.
Figure 15:
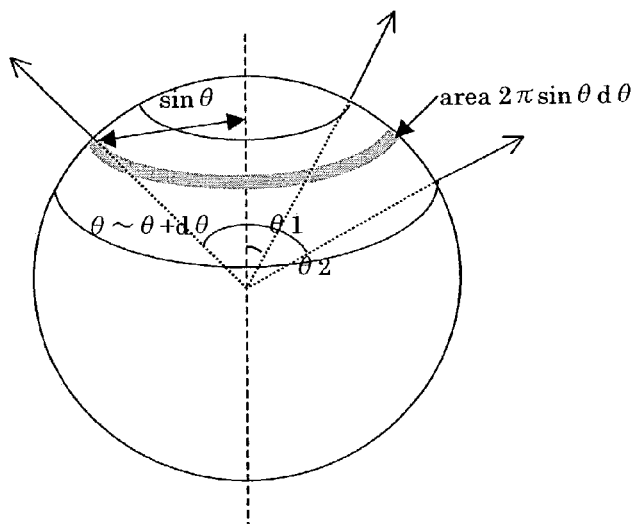
FIG. 15 is a model diagram used in simulation.

FIG. 11C is the display which includes a main body 3101, a support base 3102 and a display portion 3103.

Incidentally, the display shown in FIG. 11C is of a screen size of middle or small type or large type, for example, a screen size of 5 to 20 inches. Further, in order to form the display portion of this size, it is preferable to use a display portion having a side of a substrate of 1m and carry out mass production by taking many faces. In case that the screen having a size of middle or small type or large type is formed, it is preferable that the auxiliary electrode shown in Embodiment 2 or Embodiment 3 is formed.

As described above, a range of applying the invention is extremely wide and is applicable to a method of fabricating electronic apparatus of all the fields. Further, the electronic apparatus of the embodiment can be realized by using a constitution comprising any combination of Embodiment Modes 1 to 3 and Embodiments 1 to 3.

According to the present invention, a portion of light emitted from a layer containing an organic compound that is emitted in the lateral direction (the direction parallel to the substrate face) is reflected by a slope formed in a first electrode to thereby increase the total amount of light taken out in a certain direction (a direction in which light passes the second electrode). In short, a light emitting device with less stray light and other types of light emission loss can be obtained.

When the external light is irradiated, the light absorbing multi-layered film can prevent the electrodes and wirings except light emitting regions from reflecting light.

Furthermore, the structure of the present invention requires fewer masks in total in its manufacturing process.

What is claimed is:

1. A light emitting device comprising:
   a first electrode electrically connected with a thin film transistor over a substrate having an insulative surface;
   a light absorbing multi-layered film formed over a portion of the first electrode wherein the light absorbing multi-layered film comprises a first light transmitting film, a film comprising one selected from the group consisting of Al, Cu, Au, Mo, Ni, Pt, Rh, Ag, W, Cr, Co, Si, Zr, and Ta, and a second light transmitting film;
   a bank covering an end portion of the first electrode;
   a layer containing an organic compound formed over and in contact with a side surface of the first electrode; and
   a second electrode formed over the bank and the layer containing the organic compound,
   wherein the first electrode is a multi-layered structure, wherein a number of laminated layers of the first electrode at an end region of the first electrode is more than a number of laminated layers of the first electrode at a central region,
   wherein at least one of the first light transmitting film and the second light transmitting film is a nitride insulating film, and wherein the second electrode is formed over the light absorbing multi-layered film with the bank interposed therebetween.

2. A light emitting device according to claim 1, wherein the first electrode has an inclined surface with an angle of inclination larger than 50° and smaller than 60°.

3. A light emitting device according to claim 1, wherein the light absorbing multi-layered film contains at least one layer comprising one selected from the group consisting of $Al_2O_3$, $ZrO_2$, $HfO_2$, $Sc_2O_3$, $TiO_2$, ITO and ZnO.

4. A light emitting device according to claim 1, wherein the second electrode is a light transmitting conductive film.

5. A light emitting device according to claim 1, wherein a portion of the first electrode is etched in a self-alignment manner using the bank as a mask.

6. A light emitting device according to claim 1, wherein the first electrode is an anode and the second electrode is a cathode.

7. A light emitting device according to claim 1, wherein the light emitting device is one selected from the group consisting of a video camera, a digital camera, a goggle type display, a car navigation system, a personal computer, a DVD player, an electronic game device and a portable information terminal.

8. The light emitting device according to claim 1, wherein the organic compound emits light.

9. The light emitting device according to claim 1, wherein the layer containing the organic compound comprises a light emission layer.

10. A light emitting device comprising:
a first electrode electrically connected with a thin film transistor over a substrate having an insulative surface;
a light absorbing multi-layered film formed over a portion of the first electrode wherein the light absorbing multi-layered film comprises a first light transmitting film, a film comprising one selected from the group consisting of Al, Cu, Au, Mo, Ni, Pt, Rh, Ag, W, Cr, Co, Si, Zr, and Ta, and a second light transmitting film over the portion of the first electrode;
a bank covering and in contact with an end portion of the first electrode;
a layer containing an organic compound formed over the first electrode; and
a second electrode formed over the layer containing the organic compound,
wherein at least one of the first light transmitting film and the second light transmitting film comprises metal oxide, and
wherein the second electrode is formed over the light absorbing multi-layered film with the bank interposed therebetween.

11. A light emitting device according to claim 10, wherein the first electrode has an inclined surface wherein an inclination angle of the inclined surface is larger than 50° and smaller than 60°.

12. A light emitting device according to claim 10, wherein the metal oxide is at least one selected from the group consisting of $Al_2O_3$, $ZrO_2$, $HfO_2$, $Sc_2O_3$, $TiO_2$, ITO and ZnO.

13. A light emitting device according to claim 10, wherein the second electrode is a light transmitting conductive film.

14. A light emitting device according to claim 10, wherein the inclined surface is formed in a self-alignment manner using the bank as a mask.

15. A light emitting device according to claim 10, wherein the first electrode is an anode and the second electrode is a cathode.

16. A light emitting device according to claim 10, wherein the light emitting device is one selected from the group consisting of a video camera, a digital camera, a goggle type display, a car navigation system, a personal computer, a DVD player, an electronic game device and a portable information terminal.

17. The light emitting device according to claim 10, wherein the organic compound emits light.

18. The light emitting device according to claim 10, wherein the layer containing the organic compound comprises a light emission layer.

19. A light emitting device comprising:
a first electrode electrically connected with a thin film transistor over a substrate having an insulative surface;
a light absorbing multi-layered film formed over a portion of the first electrode wherein the light absorbing multi-layered film comprises at least three layers over the portion of the first electrode;
a bank covering and in contact with an end portion of the first electrode;
a layer containing an organic compound formed over the first electrode; and
a second electrode formed over the layer containing the organic compound,
wherein the first electrode is a multi-layered structure,
wherein a number of laminated layers of the first electrode at an end region of the first electrode is more than a number of laminated layers of the first electrode at a central region,
wherein at least one of the three layers is a light transmitting nitride insulating film,
wherein at least one of the three layers comprises a metal nitride film, and
wherein the second electrode is formed over the light absorbing multi-layered film with the bank interposed therebetween.

20. A light emitting device according to claim 19, wherein the first electrode has an inclined surface with an angle of inclination larger than 50° and smaller than 60°.

21. A light emitting device according to claim 19, wherein the light absorbing multi-layered film contains at least one layer comprising one selected from the group consisting of $Al_2O_3$, $ZrO_2$, $HfO_2$, $Sc_2O_3$, $TiO_2$, ITO and ZnO.

22. A light emitting device according to claim 19, wherein the three layers are a light transmitting nitride insulation film, the metal nitride film and a light transmitting nitride insulation film.

23. A light emitting device according to claim 19, wherein the three layers are a silicon nitride film, a titanium nitride film and a silicon nitride film.

24. A light emitting device according to claim 19, wherein the second electrode is a light transmitting conductive film.

25. A light emitting device according to claim 19, wherein a portion of the first electrode is etched in a self-alignment manner using the bank as a mask.

26. A light emitting device according to claim 19, wherein the first electrode is an anode and the second electrode is a cathode.

27. A light emitting device according to claim 19, wherein the light emitting device is one selected from the group consisting of a video camera, a digital camera, a goggle type display, a car navigation system, a personal computer, a DVD player, an electronic game device and a portable information terminal.

28. The light emitting device according to claim 19, wherein the organic compound emits light.

29. The light emitting device according to claim 19, wherein the layer containing the organic compound comprises a light emission layer.

30. A light emitting device comprising:
a first electrode electrically connected with a thin film transistor over a substrate having an insulative surface;
a light absorbing multi-layered film formed over a portion of the first electrode and comprising a silicon nitride film, a brown or black metal film, and a silicon nitride film;
a bank formed over the light absorbing multi-layered film covering and in contact with an end portion of the first electrode and an end portion of the light absorbing multi-layered film;
a layer containing an organic compound formed over the first electrode; and
a second electrode formed over the layer containing the organic compound,
wherein a reflectance of the light absorbing multi-layered film is 5% or less, and
wherein the second electrode is formed over the light absorbing multi-layered film with the bank interposed therebetween.

31. A light emitting device according to claim 30, wherein the first electrode has an inclined surface with an angle of inclination larger than 50° and smaller than 60°.

32. A light emitting device according to claim 30, wherein the second electrode is a light transmitting conductive film.

33. A light emitting device according to claim 30, wherein a portion of the first electrode is etched in a self-alignment manner using the bank as a mask.

34. A light emitting device according to claim 30, wherein the first electrode is an anode and the second electrode is a cathode.

35. A light emitting device according to claim 30, wherein the light emitting device is one selected from the group consisting of a video camera, a digital camera, a goggle type display, a car navigation system, a personal computer, a DVD player, an electronic game device and a portable information terminal.

36. The light emitting device according to claim 30, wherein the organic compound emits light.

37. The light emitting device according to claim 30, wherein the layer containing the organic compound comprises a light emission layer.

38. A light emitting device comprising:
a first electrode electrically connected with a thin film transistor over a substrate having an insulative surface;
a light absorbing multi-layered film formed over a portion of the first electrode and comprising aluminum, wherein the light absorbing multi-layered film comprises a first light transmitting film, an aluminum film, and a second light transmitting film;
a bank formed over the light absorbing film covering and in contact with an end portion of the first electrode and an end portion of the light absorbing film;
a layer containing an organic compound formed over the first electrode; and
a second electrode formed over the layer containing the organic compound,
wherein the first electrode is a multi-layered structure,
wherein a number of laminated layers of the first electrode at an end region of the first electrode is more than a number of laminated layers of the first electrode at a central region,
wherein at least one of the first light transmitting film and the second light transmitting film is a nitride insulating film, and
wherein the second electrode is formed over the light absorbing film with the bank interposed therebetween.

39. A light emitting device according to claim 38, wherein the first electrode has an inclined surface with an angle of inclination larger than 50° and smaller than 60°.

40. The light emitting device according to claim 38, wherein the organic compound emits light.

41. The light emitting device according to claim 38, the first electrode is directly connected with the thin film transistor.

42. The light emitting device according to claim 38, wherein the layer containing the organic compound comprises a light emission layer.

* * * * *